United States Patent
Hui et al.

(10) Patent No.: US 11,211,948 B2
(45) Date of Patent: Dec. 28, 2021

(54) DISTRIBUTED CRC-ASSISTED POLAR CODE CONSTRUCTION

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US); Michael Breschel, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/619,703

(22) PCT Filed: Jun. 6, 2018

(86) PCT No.: PCT/IB2018/054056
§ 371 (c)(1),
(2) Date: Dec. 5, 2019

(87) PCT Pub. No.: WO2018/224982
PCT Pub. Date: Dec. 13, 2018

(65) Prior Publication Data
US 2020/0186170 A1  Jun. 11, 2020

Related U.S. Application Data

(60) Provisional application No. 62/515,790, filed on Jun. 6, 2017.

(51) Int. Cl.
*H03M 13/29* (2006.01)
*H04L 1/00* (2006.01)
(Continued)

(52) U.S. Cl.
CPC ..... *H03M 13/2915* (2013.01); *H03M 13/091* (2013.01); *H03M 13/093* (2013.01);
(Continued)

(58) Field of Classification Search
CPC .......................... H03M 13/2915; H04L 1/0042
See application file for complete search history.

(56) References Cited

U.S. PATENT DOCUMENTS

| | | | | |
|---|---|---|---|---|
| 6,105,155 A | * | 8/2000 | Cheng | ............. G06F 11/1008 714/735 |
| 2014/0169388 A1 | * | 6/2014 | Jeong | ............. H03M 13/1191 370/474 |

(Continued)

OTHER PUBLICATIONS

3GPP TSG RAN WG1 Meeting #89; Hangzhou, China; Source: Huawei, HiSilicon; Title: Polar code design (R1-1706965)—May 15-19, 2017.

(Continued)

*Primary Examiner* — Joseph D Torres
(74) *Attorney, Agent, or Firm* — Baker Botts, LLP

(57) ABSTRACT

According to some embodiments, a method in a wireless device comprises obtaining a set of information bits for wireless transmission and dividing the set of information bits into one or more subsets of information bits. For each subset, generating extra cyclic redundancy check (CRC) bits using a CRC polynomial capable of generating N CRC bits. The extra CRC bits for each subset comprise less than N CRC bits. The method further comprises: generating a final set of N or less CRC bits for the set of information bits using the CRC polynomial; generating a set of coded bits by encoding the set of information bits for wireless transmission, together with the extra CRC bits and the final set of CRC bits, using a polar encoder; and transmitting the set of coded bits using a wireless transmitter.

9 Claims, 14 Drawing Sheets

(51) Int. Cl.
  *H03M 13/09* (2006.01)
  *H03M 13/15* (2006.01)
  *H03M 13/00* (2006.01)

(52) U.S. Cl.
  CPC ..... *H03M 13/151* (2013.01); *H03M 13/2906* (2013.01); *H03M 13/618* (2013.01); *H03M 13/6502* (2013.01); *H04L 1/0041* (2013.01); *H04L 1/0042* (2013.01)

(56) References Cited

U.S. PATENT DOCUMENTS

| | | | |
|---|---|---|---|
| 2014/0173376 A1* | 6/2014 | Jeong | H04L 1/0041 714/755 |
| 2017/0155405 A1* | 6/2017 | Ge | H04L 1/0061 |
| 2017/0214416 A1* | 7/2017 | Ge | H03M 13/13 |

OTHER PUBLICATIONS

3GPP TSG RAN WG1 NR Ad-Hoc#2; Qingdao, P.R. China; Source: Ericsson; Title: CRC-based Polar Code Construction (R1-1710490)—Jun. 27-30, 2017.
PCT International Search Report for International application No. PCT/IB2018/054056—dated Sep. 19, 2018.
PCT Written Opinion of the International Searching Authority for International application No. PCT/IB2018/054056—dated Sep. 19, 2018.
3GPP TSG RAN WG1 #89; Hangzhou, China; Source: Samsung; Title: Early Termination of Polar Decoding (R1-1709159, which is a revision of R1-1708047)—May 15-19, 2017.
Erdal Arikan, "Channel Polarization: A Method for Constructing Capacity-Achieving Codes for Symmetric Binary-Input Memoryless Channels," IEEE Transactions on Information Theory, vol. 55, No. 7, Jul. 2009.
Ido Tai et al., "List Decoding of Polar Codes," IEEE International Symposium on Information Theory Proceedings, 2011.

* cited by examiner

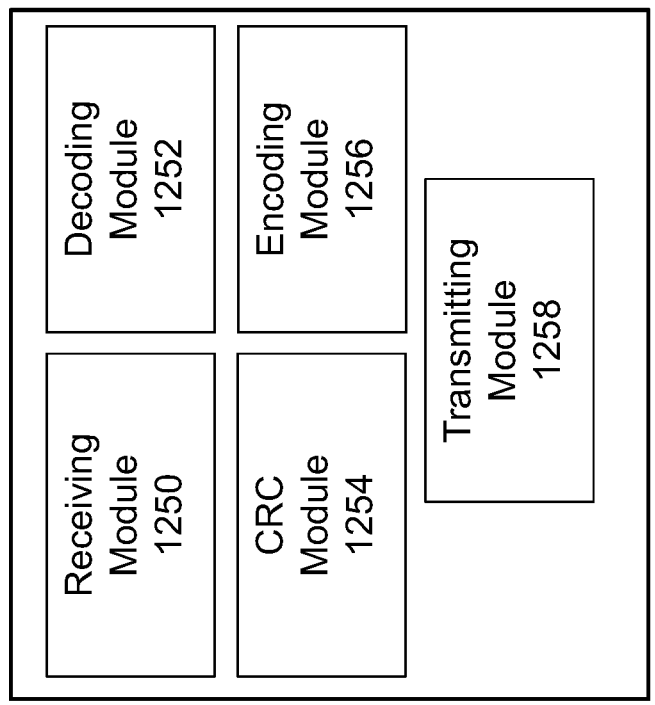
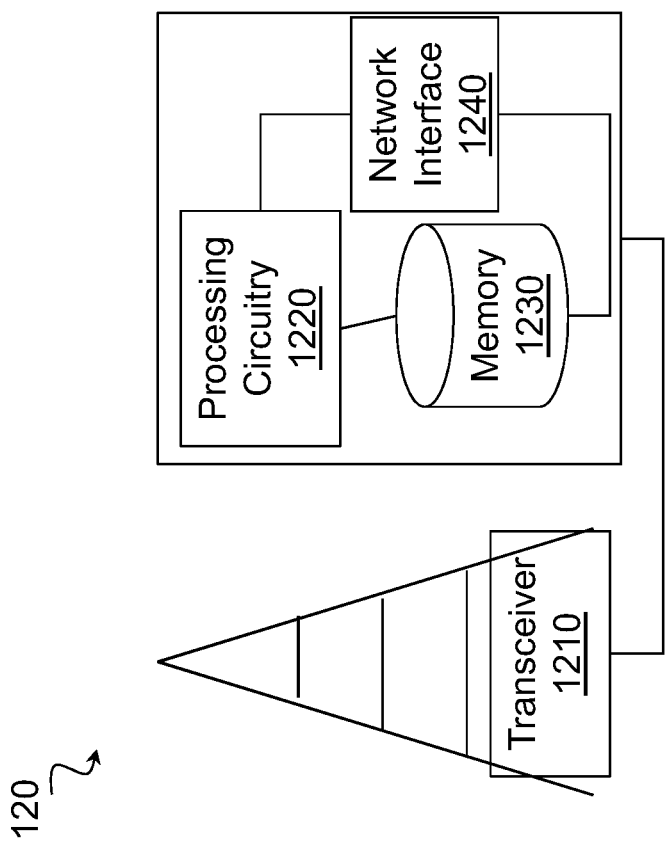

DISTRIBUTED CRC-ASSISTED POLAR CODE CONSTRUCTION

PRIORITY

This nonprovisional application is a U.S. National Stage Filing under 35 U.S.C. § 371 of International Patent Application Serial No. PCT/IB2018/054056 filed Jun. 6, 2018 and entitled "*Distributed CRC-Assisted Polar Code Construction*" which claims priority to U.S. Provisional Patent Application No. 62/515790 filed Jun 6, 2017 both of which are hereby incorporated by reference in their entirety.

TECHNICAL FIELD

Particular embodiments are directed to wireless communications and, more particularly, to cyclic redundancy check (CRC) extension through partial encoding of a radio transmission.

INTRODUCTION

Polar codes, proposed by Arikan (E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009), are a class of constructive coding schemes that achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. A SC list (SCL) decoder proposed in I. Tal and A. Vardy, "List Decoding of polar codes," in Proceedings of IEEE Symp. Inf. Theory, pp. 1-5, 2011 can approach the performance of optimal maximum-likelihood (ML) decoder. By concatenating a simple CRC coding, the performance of concatenated polar codes is competitive with that of well-optimized LDPC and Turbo codes. As a result, polar codes may be used for 5G wireless communication systems.

Polar coding transforms a pair of identical binary-input channels into two distinct channels of different qualities, one better and one worse than the original binary-input channel By repeating such a pair-wise polarizing operation on a set of $2^M$ independent uses of a binary-input channel, a set of $2^M$ "bit-channels" of varying qualities is obtained. Some of the bit channels are nearly perfect (i.e., error free), while the rest of them are nearly useless (i.e., totally noisy). Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non-frozen (or information) bits, respectively.

Only the non-frozen bits are used to carry data in a polar code. Loading the data into the proper information bit locations has a direct impact on the performance of a polar code. An illustration of the structure of a length-8 polar code is illustrated in FIG. 1.

Although the original polar code as proposed by Arikan was proven to be capacity achieving with a low-complexity successive cancellation (SC) decoder, a particular problem is that the finite-length performance of polar codes under SC is not competitive compared to other modern channel coding schemes, such as LDPC and Turbo codes.

The more complex SC list (SCL) decoder maintains a list of more than one surviving decision paths in the decoding process, but the resulting performance is still unsatisfactory. A SCL decoder may concatenate a linear outer code, namely a Cyclic Redundancy Check (CRC) code, with the original polar code as inner code, and the outer code can be used to check if any of the candidate paths in the list is correctly decoded. In other words, the block of information bits first passes through a CRC encoder before both the CRC code bits and the information bits are encoded by the polar encoder. The CRC code bits are typically appended at the end of the block of information bits so that at the decoder they are decoded in the end after all information bits are decoded. The two-step decoding process significantly improves the performance and makes polar codes competitive with that of well-optimized LDPC and Turbo codes.

However, when the CRC code is also used for error detection purposes, the length of the CRC code needs to increase with the list size (i.e., number of candidate paths) to avoid corroding the error detection capability of the CRC code, which is typically measured by the false alarm rate (FAR) (i.e., the probability of falsely accepting or passing an incorrectly decoded codeword). Consequently, multiple CRC polynomials of different degrees may be needed to generate CRC codes of different lengths to accommodate different list sizes, which complicates the design and implementation of polar codes.

In addition, unlike LDPC codes where the message-passing decoding algorithms can often be parallelized, the SCL decoding of polar codes is sequential in nature and cannot be parallelized. As a result, the decoding latency is relatively high for polar codes. Methods of early termination (ET) of the decoding process based on early detection of an erred reception is therefore desirable.

One early termination method is to place some of the CRC bits closer to the beginning of the successive decoding order instead of placing them in the end as is normally done. The decoder can verify the values of these CRC bits based on the previously decoded information bits and on the known relationship between the information bits and the CRC bits. If any of the detected CRC bit values is inconsistent with the previously decoded information bits for every candidate path in the list, the decoder can declare an erred block before reaching the end of the decoding process and thus reduce the average decoding latency. However, the feasibility of this method hinges on that the CRC bits that are moved towards the beginning depend only on the information bits in front of them. Therefore, only properly selected and designed CRC bits can be used for this purpose.

SUMMARY

The embodiments described herein include generating arbitrarily many additional cyclic redundancy check (CRC) bits based on a given CRC polynomial. The same CRC polynomial may be used to generate a different number of CRC bits. Particular embodiments overcome the challenges associated with the use of different CRC polynomials for different SCL decoding list sizes. The extra CRC bits maintain the error correcting capability of the extended CRC code in terms of false alarm rate (FAR) performance when the CRC bits are used for both error-correcting and error-detecting functionalities. They are also suitable to be placed closer to the beginning of the successive decoding process to achieve reduced latency through early termination. In addition, the extra CRC bits can be taken from the intermediate results during the CRC encoding and checking process, which adds minimal complexity to produce the extra CRC bits.

Two general embodiments include non-recursive and recursive variants. In the non-recursive variants, the extra CRC code bits are generated non-recursively, which means that CRC bits generated later are not computed using the values of the CRC bits generated earlier as input. In the recursive variants, the extra CRC code bits are generated recursively, which means that CRC bits generated later are computed using the values of the CRC bits generated earlier as input along with other information bits.

According to some embodiments, a method for use in a wireless transmitter comprises obtaining a set of information bits for wireless transmission and dividing the set of information bits into one or more subsets of information bits. For each subset of the one or more subsets of information bits, the method comprises generating extra CRC bits using a CRC polynomial capable of generating N CRC bits and wherein the extra CRC bits for each subset of information bits comprise less than N CRC bits. The method further comprises: generating a final set of N or less CRC bits for the set of information bits using the CRC polynomial; generating a set of coded bits by encoding the set of information bits for wireless transmission, together with the extra CRC bits and the final set of CRC bits, using a polar encoder; and transmitting the set of coded bits using a wireless transmitter.

In particular embodiments, dividing the information bits into one or more subsets of information bits comprises dividing the information bits into separate subsets (i.e., each subset includes different information bits than the other subsets), or dividing the information bits into nested subsets (i.e., each successive subset includes the information bits from a previous subset).

In particular embodiments, generating extra CRC bits using the CRC polynomial comprises recursive generation (i.e., a set of extra CRC bits for a first subset of the one or more subsets of information bits are included a second subset of the one or more subsets of information bits and used as input in a subsequent generation of extra CRC bits for the second subset of information bits), or non-recursive generation (i.e., a set of extra CRC bits for a first subset of the one or more subsets of information bits are not included a second subset of the one or more subsets of information bits and are not used as input in a subsequent generation of extra CRC bits for the second subset of information bits). Generating extra CRC bits may comprise using a shift register where intermediate values in the shift register are used for determining the extra CRC bits.

In particular embodiments, encoding the set of information bits for wireless transmission comprises inserting the extra CRC bits for each subset of information bits after its corresponding subset of information bits, or inserting the extra CRC bits for each subset of information bits as a group after the set of information bits. A number of extra CRC bits for each successive subset of the one or more subsets of information bits may be greater than or equal to a number of extra CRC bits for a previous subset of the one or more subsets of information bits.

In particular embodiments, the wireless transmitter comprises a network node or a wireless device.

According to some embodiments, a wireless transmitter comprises processing circuitry operable to obtain a set of information bits for wireless transmission and divide the set of information bits into one or more subsets of information bits. For each subset of the one or more subsets of information bits, the processing circuitry is operable to generate extra CRC bits using a CRC polynomial capable of generating N CRC bits. The extra CRC bits for each subset of information bits comprise less than N CRC bits. The processing circuitry is further operable to: generate a final set of N or less CRC bits for the set of information bits using the CRC polynomial; generate a set of coded bits by encoding the set of information bits for wireless transmission, together with the extra CRC bits and the final set of CRC bits, using a polar encoder; and transmit the set of coded bits using a wireless transmitter.

In particular embodiments, the processing circuitry is operable to divide the information bits into one or more subsets of information bits by dividing the information bits into separate subsets or into nested subsets.

In particular embodiments, the processing circuitry is operable to generate extra CRC bits using the CRC polynomial by recursive generation or non-recursive generation. The processing circuitry operable to generate extra CRC bits may comprise a shift register where intermediate values in the shift register are used for determining the extra CRC bits.

In particular embodiments, the processing circuitry is operable to encode the set of information bits for wireless transmission by inserting the extra CRC bits for each subset of information bits after its corresponding subset of information bits, or by inserting the extra CRC bits for each subset of information bits as a group after the set of information bits. A number of extra CRC bits for each successive subset of the one or more subsets of information bits may be greater than or equal to a number of extra CRC bits for a previous subset of the one or more subsets of information bits.

In particular embodiments, the wireless transmitter comprises a network node or a wireless device.

According to some embodiments, a method for use in a wireless receiver comprises receiving a set of polar encoded information bits and CRC bits from a wireless transmitter. The set of information bits includes one or more subsets of information bits and each of the subsets of information bits is associated with extra CRC bits generated using a CRC polynomial capable of generating N CRC bits and wherein the extra CRC bits for each subset of information bits comprise less than N CRC bits. The set of information bits is associated with a set of N or less CRC bits generated by the CRC polynomial. The method further comprises polar decoding the set of coded bits using the one or more sets of extra CRC bits.

In particular embodiments, the one or more subsets of information bits comprise separate subsets (i.e., each subset includes different information bits than the other subsets). In particular embodiments, each successive subset includes the information bits from a previous subset.

In particular embodiments, the extra CRC bits are recursively generated (i.e., a set of extra CRC bits for a first subset of the one or more subsets of information bits are included in a second subset of the one or more subsets of information bits and used as input in a subsequent generation of extra CRC bits for the second subset of information bits). In particular embodiments, the extra CRC bits are non-recursively generated (i.e., a set of extra CRC bits for a first subset of the one or more subsets of information bits are not included a second subset of the one or more subsets of information bits and are not used as input in a subsequent generation of extra CRC bits for the second subset of information bits).

In particular embodiments, the extra CRC bits for each subset of information bits are positioned after its associated subset of information bits and before the extra CRC bits for a subsequent subset of information bits. In particular embodiments, the extra CRC bits for each subset of information bits are positioned as a group after the set of information bits. A number of extra CRC bits for each successive subset of the one or more subsets of information bits may be greater than or equal to a number of extra CRC bits for a previous subset of the one or more subsets of information bits.

In particular embodiments, the decoding further comprises terminating decoding of the received information bits when the decoding reaches an extra CRC bit of the one or more sets of extra CRC bits and no candidate path of the polar decoder satisfies the extra CRC bit. In particular embodiments, the decoding further comprises rejecting paths that do not satisfy an extra CRC bit when the decoding reaches the extra CRC bit of the one more sets of extra CRC bits.

In particular embodiments, the wireless receiver comprises a wireless device or a network node.

According to some embodiments, a wireless receiver comprises processing circuitry operable to receive a set of polar encoded information bits and CRC bits from a wireless transmitter. The set of information bits includes one or more subsets of information bits and each of the subsets of information bits is associated with extra CRC bits generated using a CRC polynomial capable of generating N CRC bits. The extra CRC bits for each subset of information bits comprise less than N CRC bits. The set of information bits is associated with a set of N or less CRC bits generated by the CRC polynomial. The processing circuitry is further operable to polar decode the set of coded bits using the one or more sets of extra CRC bits.

In particular embodiments, the one or more subsets of information bits comprise separate subsets or nested subsets. The extra CRC bits may be recursively or non-recursively generated. The extra CRC bits for each subset of information bits may be positioned after its associated subset of information bits and before the extra CRC bits for a subsequent subset of information bits, or the extra CRC bits for each subset of information bits are positioned as a group after the set of information bits. A number of extra CRC bits for each successive subset of the one or more subsets of information bits may be greater than or equal to a number of extra CRC bits for a previous subset of the one or more subsets of information bits.

In particular embodiments, the processing circuitry is operable to terminate decoding of the received information bits when the decoding reaches an extra CRC bit of the one or more sets of extra CRC bits and no candidate path of the polar decoder satisfies the extra CRC bit. In particular embodiments, the processing circuitry is operable to reject paths that do not satisfy an extra CRC bit when the decoding reaches the extra CRC bit of the one more sets of extra CRC bits.

In particular embodiments, the wireless receiver comprises a wireless device or a network node.

According to some embodiments, a wireless transmitter comprises a receiving module, a CRC module, an encoding module and a transmitting module. The receiving module is operable to obtain a set of information bits for wireless transmission. The CRC module is operable to: divide the set of information bits into one or more subsets of information bits; for each subset of the one or more subsets of information bits, generate extra CRC bits using a CRC polynomial capable of generating N CRC bits and wherein the extra CRC bits for each subset of information bits comprise less than N CRC bits; and generate a final set of N or less CRC bits for the set of information bits using the CRC polynomial. The encoding module is operable to generate a set of coded bits by encoding the set of information bits for wireless transmission, together with the extra CRC bits and the final set of CRC bits, using a polar encoder. The transmitting module is operable to transmit the set of coded bits using a wireless transmitter.

According to some embodiments, a wireless receiver comprises a receiving module and a decoding module. The receiving module is operable to receive a set of polar encoded information bits and CRC bits from a wireless transmitter. The set of information bits includes one or more subsets of information bits and each of the subsets of information bits is associated with extra CRC bits generated using a CRC polynomial capable of generating N CRC bits. The extra CRC bits for each subset of information bits comprise less than N CRC bits. The set of information bits is associated with a set of N or less CRC bits generated by the CRC polynomial. The decoding module operable to polar decode the set of coded bits using the one or more sets of extra CRC bits.

Also disclosed is a computer program product. The computer program product comprises instructions stored on non-transient computer-readable media which, when executed by a processor, perform the steps of obtaining a set of information bits for wireless transmission and dividing the set of information bits into one or more subsets of information bits. For each subset of the one or more subsets of information bits, the instructions further perform the step of generating extra CRC bits using a CRC polynomial capable of generating N CRC bits. The extra CRC bits for each subset of information bits comprise less than N CRC bits. The instructions further perform the steps of: generating a final set of N or less CRC bits for the set of information bits using the CRC polynomial; generating a set of coded bits by encoding the set of information bits for wireless transmission, together with the extra CRC bits and the final set of CRC bits, using a polar encoder; and transmitting the set of coded bits using a wireless transmitter.

Another computer program product comprises instructions stored on non-transient computer-readable media which, when executed by a processor, perform the step of receiving a set of polar encoded information bits and CRC bits from a wireless transmitter. The set of information bits includes one or more subsets of information bits and each of the subsets of information bits is associated with extra CRC bits generated using a CRC polynomial capable of generating N CRC bits and wherein the extra CRC bits for each subset of information bits comprise less than N CRC bits. The set of information bits is associated with a set of N or less CRC bits generated by the CRC polynomial. The instructions further perform the step of polar decoding the set of coded bits using the one or more sets of extra CRC bits.

Particular embodiments may exhibit some of the following technical advantages. For example, an arbitrary number of extra CRC bits may be generated from a single CRC polynomial with little additional complexity. Particular embodiments decouple the choice of the CRC polynomial from the SCL decoding list size. The extra CRC bits generated by some embodiments maintain the error correcting capability of the extended CRC code in terms of FAR performance. They are also suitable to be placed closer to the beginning of the successive decoding process so that CRC checking can be done early in a bit-by-bit fashion for each individual CRC bit over all candidate paths of the SCL decoding list. This facilitates early termination of decoding and improves the average decoding latency as a result. The choice of the CRC polynomial is also decoupled from the placement of the extra CRC bits. Other technical advantages will be readily apparent to one skilled in the art from the following figures, description, and example embodiments.

BRIEF DESCRIPTION OF THE DRAWINGS

For a more complete understanding of the embodiments and their features and advantages, reference is now made to the following description, taken in conjunction with the accompanying drawings, in which:

FIG. 12A is a block diagram illustrating an example embodiment of a network node;

FIG. 12B is a block diagram illustrating example components of a network node.

DETAILED DESCRIPTION

Figure 1:
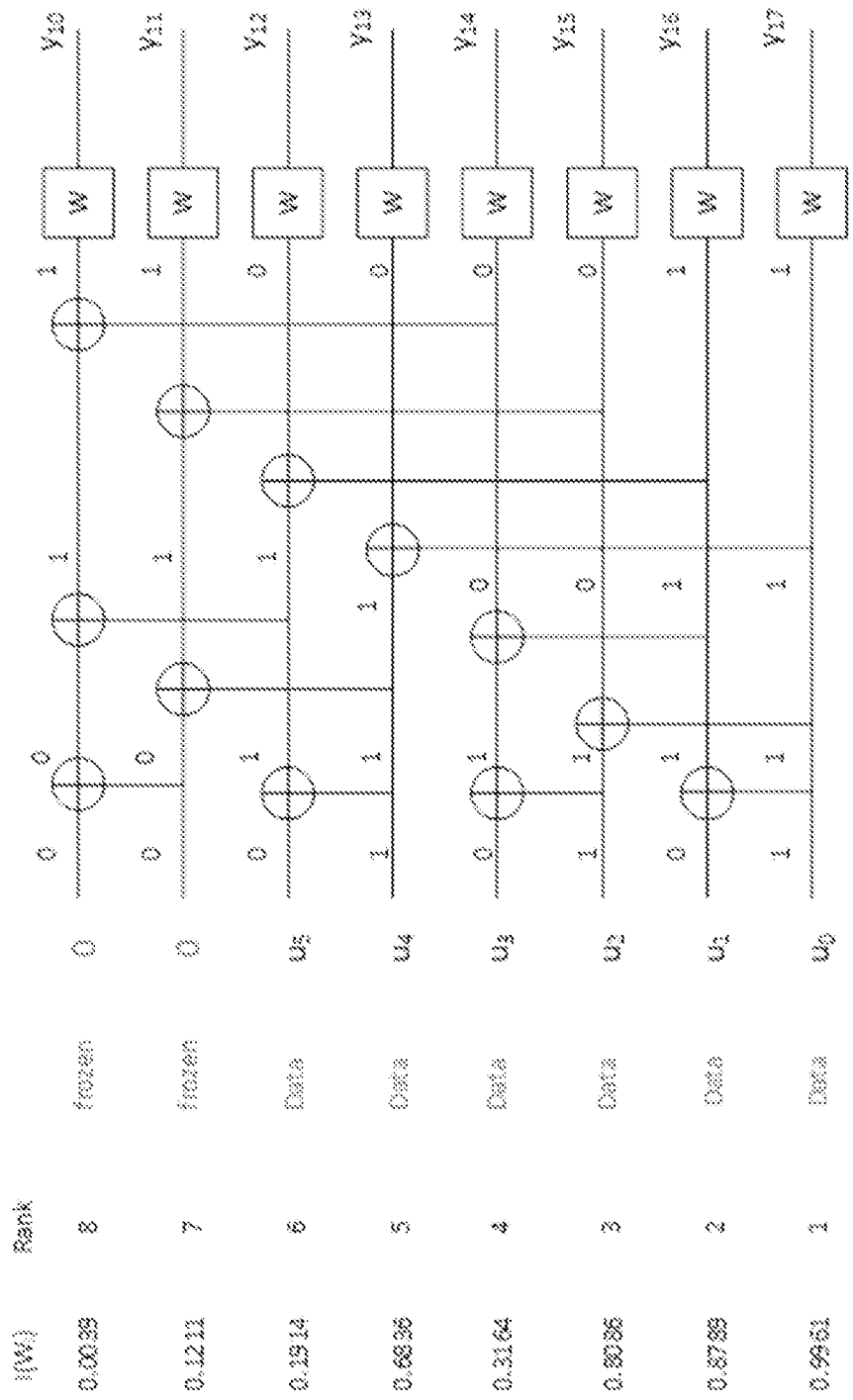
FIG. 1 illustrates an example of a polar code structure with N=8.

Fifth generation (5G) wireless communication systems may use polar codes. Polar coding transforms a pair of identical binary-input channels into two distinct channels of different qualities, one better and one worse than the original binary-input channel Repeating the pair-wise polarizing operation on a set of $2^M$ independent uses of a binary-input channel results in a set of $2^M$ bit-channels of varying qualities. Some of the bit channels are nearly perfect (i.e., error free), while the rest of them are nearly useless (i.e., totally noisy). Polar coding uses the nearly perfect channel to transmit data to the receiver and sets the input to the useless channels to have fixed or frozen values (e.g., 0) known to the receiver.

Polar coding may achieve a desired capacity with a low-complexity successive cancellation (SC) decoder, but a particular problem is that the finite-length performance of polar codes under SC is not competitive compared to other modern channel coding schemes such as LDPC and Turbo codes. The more complex SC list (SCL) decoder maintains a list of more than one surviving decision paths in the decoding process, but the resulting performance is still unsatisfactory. To further improve code performance, one may concatenate a linear outer code, such as a Cyclic Redundancy Check (CRC) code, with the original polar code as an inner code. In the decoding process, a SCL decoder can use the outer code to check if any of the candidate paths in the list is correctly decoded. The CRC code bits are typically appended at the end of the block of information bits so that at the decoder they are decoded in the end after all information bits are decoded. The two-step decoding process significantly improves the performance and makes polar codes competitive with that of well-optimized LDPC and Turbo codes.

However, when the CRC code is also used for error detection purpose, the length of the CRC code needs to increase with the list size (i.e., number of candidate paths) to avoid corroding the error detection capability of the CRC code, which is typically measured by the false alarm rate (FAR). Consequently, multiple CRC polynomials of different degrees may be needed to generate CRC codes of different lengths to accommodate different list sizes, which complicates the design and implementation of polar codes.

In addition, unlike LDPC codes where the message-passing decoding algorithms can often be parallelized, the SCL decoding of polar codes is sequential in nature and cannot be parallelized. As a result, the decoding latency is relatively high for polar codes. Methods of early termination (ET) of the decoding process based on early detection of an erred reception is therefore desirable.

One early termination method is to place some of the CRC bits closer to the beginning of the successive decoding order instead of placing them in the end as is normally done. The decoder can verify the values of these CRC bits based on the previously decoded information bits and on the known relationship between the information bits and the CRC bits. If any of the detected CRC bit values is inconsistent with the previously decoded information bits for every candidate path in the list, the decoder can declare an erred block before reaching the end of the decoding process and thus reduce the average decoding latency. However, the feasibility of this method hinges on that the CRC bits that are moved towards the beginning depend only on the information bits in front of them. Therefore, only properly selected and designed CRC bits can be used for this purpose.

Particular embodiments obviate the problems described above and include generating arbitrarily many additional CRC bits (also referred to as extra CRC bits) based on a given CRC polynomial. The same CRC polynomial may be used to generate a different number of CRC bits. Particular embodiments overcome the challenges associated with the use of different CRC polynomials for different SCL decoding list sizes. The extra CRC bits maintain the error correcting capability of the extended CRC code in terms of FAR performance. They are also suitable to be placed closer to the beginning of the successive decoding process (i.e., distributed towards the front of the information bits) to achieve reduced latency through early termination. In addition, the extra CRC bits can be taken from the intermediate results during the CRC encoding and checking process, which adds minimal complexity to produce the extra CRC bits.

Two general embodiments include non-recursive and recursive variants. In the non-recursive embodiments, the extra CRC code bits are generated non-recursively, which means that CRC bits generated later are not computed using the values of the CRC bits generated earlier as input. In the recursive embodiments, the extra CRC code bits are generated recursively, which means that CRC bits generated later are computed using the values of the CRC bits generated earlier as input along with other information bits.

As a particular advantage, an arbitrary number of extra CRC bits may be generated from a single CRC polynomial with little additional complexity. Particular embodiments decouple the choice of the CRC polynomial from the SCL decoding list size. The extra CRC bits generated by some embodiments maintain the error correcting capability of the extended CRC code in terms of FAR performance. The extra CRC bits generated by some embodiments are also suitable to be placed closer to the beginning of the successive decoding process so that CRC checking can be done early in a bit-by-bit fashion for each individual CRC bit over all candidate paths of the SCL decoding list. This facilitates early termination of decoding and improves the average decoding latency as a result. The choice of the CRC polynomial is also decoupled from the placement of the extra CRC bits.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 2-14 of the drawings, like numerals being used for like and corresponding parts of the various drawings. Long term evolution (LTE) and 5G new radio (NR) are used throughout this disclosure as an example cellular system, but the ideas presented herein may apply to other wireless communication systems as well.

Figure 2:
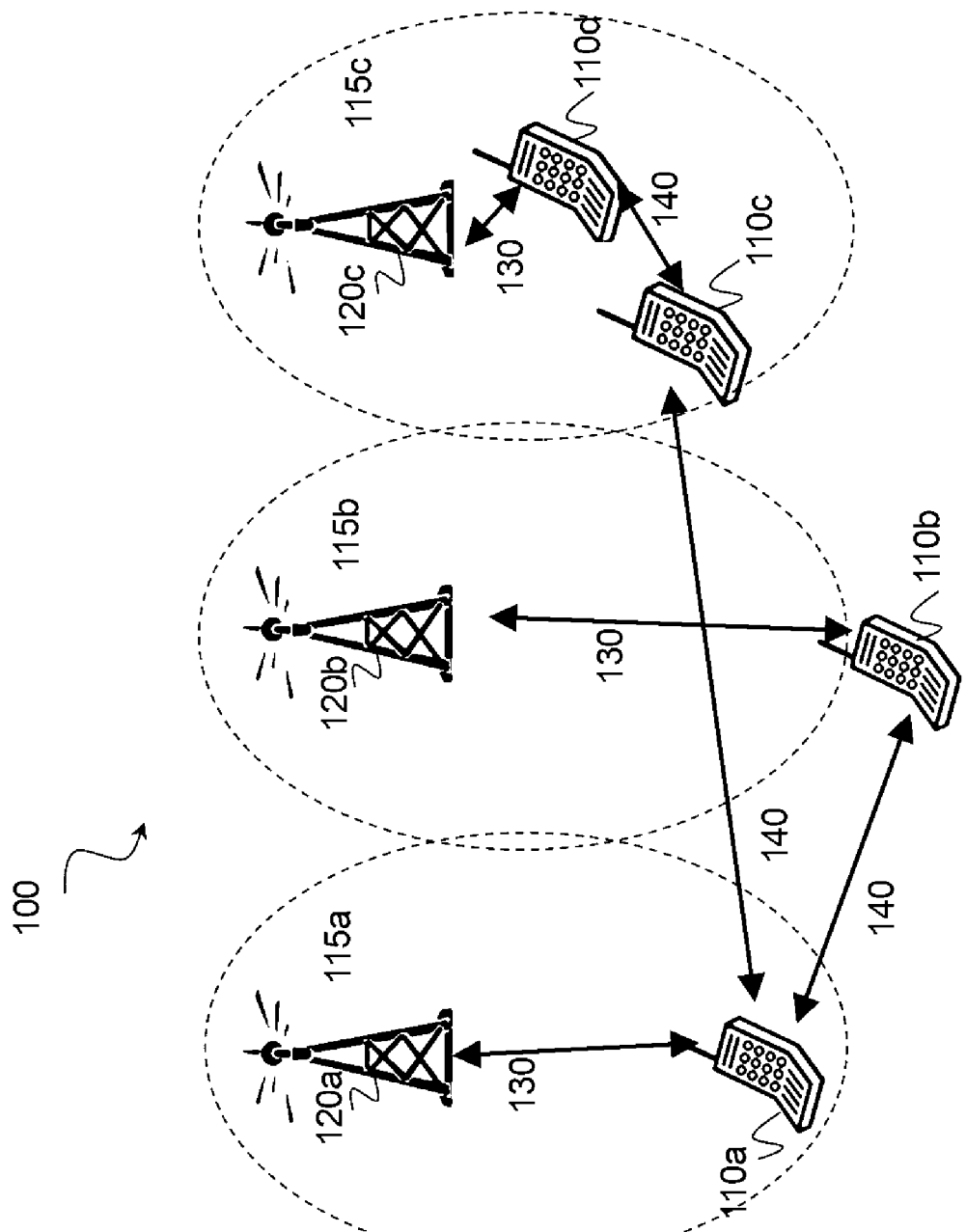
FIG. 2 is a block diagram illustrating an example wireless network, according to some embodiments.

FIG. 2 is a block diagram illustrating an example wireless network, according to a particular embodiment. Wireless network 100 includes one or more wireless devices 110 (such as mobile phones, smart phones, laptop computers, tablet computers, MTC devices, V2X devices, or any other devices that can provide wireless communication) and a plurality of network nodes 120 (such as base stations or eNodeBs). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals.

A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120). In LTE, the interface for communicating wireless signals between network node 120 and wireless device 110 may be referred to as a Uu interface.

Each network node 120 may have a single transmitter or multiple transmitters for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

Wireless devices 110 may communicate with each other (i.e., D2D operation) by transmitting and receiving wireless signals 140. For example, wireless device 110a may communicate with wireless device 110b using wireless signal 140. Wireless signal 140 may also be referred to as sidelink 140. Communication between two wireless devices 110 may be referred to as D2D communication or sidelink communication. In LTE, the interface for communicating wireless signal 140 between wireless device 110 may be referred to as a PC5 interface.

Wireless device 110, network node 120, or any other component of network 100 that transmits wireless signals may be referred to as a wireless transmitter. Wireless device 110, network node 120, or any other component of network 100 that receives wireless signals may be referred to as a wireless receiver.

In particular embodiments, wireless device 110 and network node 120 may encode and decode wireless signals 130 using polar coding. For example, a wireless transmitter such as network node 120 may obtain a set of information bits for wireless transmission and divide the set of information bits into one or more subsets of information bits. For each subset of the one or more subsets of information bits, network node 120 may generate extra CRC bits using a CRC polynomial capable of generating N CRC bits. The extra CRC bits for each subset of information bits comprise less than N CRC bits. Network node 120 may generate a final set of N or less CRC bits for the set of information bits using the CRC polynomial. Network node 120 may generate a set of coded bits by encoding the set of information bits for wireless transmission, together with the extra CRC bits and the final set of CRC bits, using a polar encoder; and transmit the set of coded bits using a wireless transmitter.

A wireless receiver, such as wireless device 110 may receive the set of polar encoded information bits and CRC bits from a wireless transmitter. Wireless device 110 may polar decode the set of coded bits using the one or more sets of extra CRC bits. Wireless device 110 may terminate decoding of the received information bits when the decoding reaches an extra CRC bit of the one or more sets of extra CRC bits and no candidate path of the polar decoder satisfies the extra CRC bit. In some embodiments, wireless device 110 may reject paths that do not satisfy an extra CRC bit when the decoding reaches the extra CRC bit of the one more sets of extra CRC bits. Polar coding and generation and use of CRC codes is described in more detail with respect to FIGS. 3-14.

In wireless network 100, each network node 120 may use any suitable radio access technology, such as long term evolution (LTE), 5G NR, LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 11A below. Similarly, a network node may include any suitable combination of hardware and/or software. For example, in particular embodiments, a network node, such as network node 120, may include the components described with respect to FIG. 12A below.

Particular embodiments may be described according to the following equations. Let $I=(b_0, b_1, \ldots, b_{K-1})$ be a block of K information bits, and let $$I(x) = \sum_{i=0}^{K-1} b_i x^i$$

be the associated polynomial of the information block. Also let $$p_{CRC}(x) = \sum_{i=0}^{c_0} P_i x^i$$

be a CRC polynomial used to encode $I(x)$, where $c_0$ denotes the number of normal CRC bits generated from the CRC polynomial $p_{CRC}(x)$. The normal CRC bits are the coefficients $R_0 = (R_0^{(0)}, R_1^{(0)}, \ldots, R_{c_0-1}^{(0)})$ of the remainder polynomial:

$$R_0(x) = \sum_{i=0}^{c_0-1} R_i x^i$$

that satisfies $$I(x) = Q_0(x) p_{CRC}(x) + R_0(x)$$

for some quotient polynomial $Q_0(x)$.

Particular embodiments generate extra CRC bits by first encoding an ordered subset $I_1 = (b_{j_0}, b_{j_1}, \ldots, b_{j_{K_1-1}}) \subset I$ of $K_1$ information bits using the same CRC polynomial $p_{CRC}(x)$, where $j_i \in \{0, 1, \ldots, K\}$ for all $i \in \{0, 1, \ldots, K_1-1\}$ and then extracting some of the resulting CRC bits as the extra CRC bits. More precisely, let $$R_1(x) = \sum_{i=0}^{c_0-1} R_i^{(1)} x^i$$

be the remainder polynomial of degree $c_0-1$ that satisfies $$I_1(x) = Q_1(x) p_{CRC}(x) + R_1(x)$$

where $$I_1(x) = \sum_{i=0}^{K_1-1} b_{j_i} x^i$$

denotes the polynomial corresponding to the subset $I_1$ of information bits, and $Q_1(x)$ denotes some quotient polynomial. Extra CRC bits are generated by taking some subset of size $c_1$ of the coefficients $R_1 = (R_0^{(1)}, R_1^{(1)}, \ldots, R_{c_0-1}^{(1)})$.

The process can be repeated for another subset $I_t \subset I$ of information bits to obtain $c_t$ extra CRC bits for t=2. In general, the process can be repeated T times for a collection of subsets $\{I_t\}_{t=1}^T$ of information bits, where $I_t \subset I$ for all t, to generate $c' \triangleq \Sigma_{t=1}^T c_t$ extra CRC bits and $c \triangleq \Sigma_{t=0}^T c_t$ total number of CRC bits, including the $c_0$ normal CRC bits. Note that the same CRC polynomial $p_{CRC}(x)$ may be used throughout the entire process. In general, two different subsets $I_t$ of information bits may or may not have any overlap.

Two general categories of embodiments are described below. The first category includes a non-recursive embodiment where any set of extra CRC code bits are not re-encoded in the generation of the next set of extra CRC code bits. Different sets of extra CRC code bits are computed solely based on different (ordered) subsets of information bits.

The second category includes a recursive embodiment where any set of extra CRC code bits are re-encoded in the generation of the next set of extra CRC code bits. Different sets of extra CRC code bits are computed not only based on different (ordered) subsets of information bits but also some or all previously generated sets of extra CRC code bits. In some embodiments, the different sets of extra CRC code bits are computed based on the relevant information bits and all previously generated sets of extra CRC code bits. The recursive embodiments mimic the nested CRC paradigm typically employed in Open System Interconnection (OSI) layered communication model.

In the non-recursive embodiments, the extra CRC code bits are generated non-recursively, which means that CRC code bits generated later are not computed using the values of the CRC bits generated earlier as input. The encoder structure of the overall proposed code is illustrated in FIG. 3.

Figure 3:
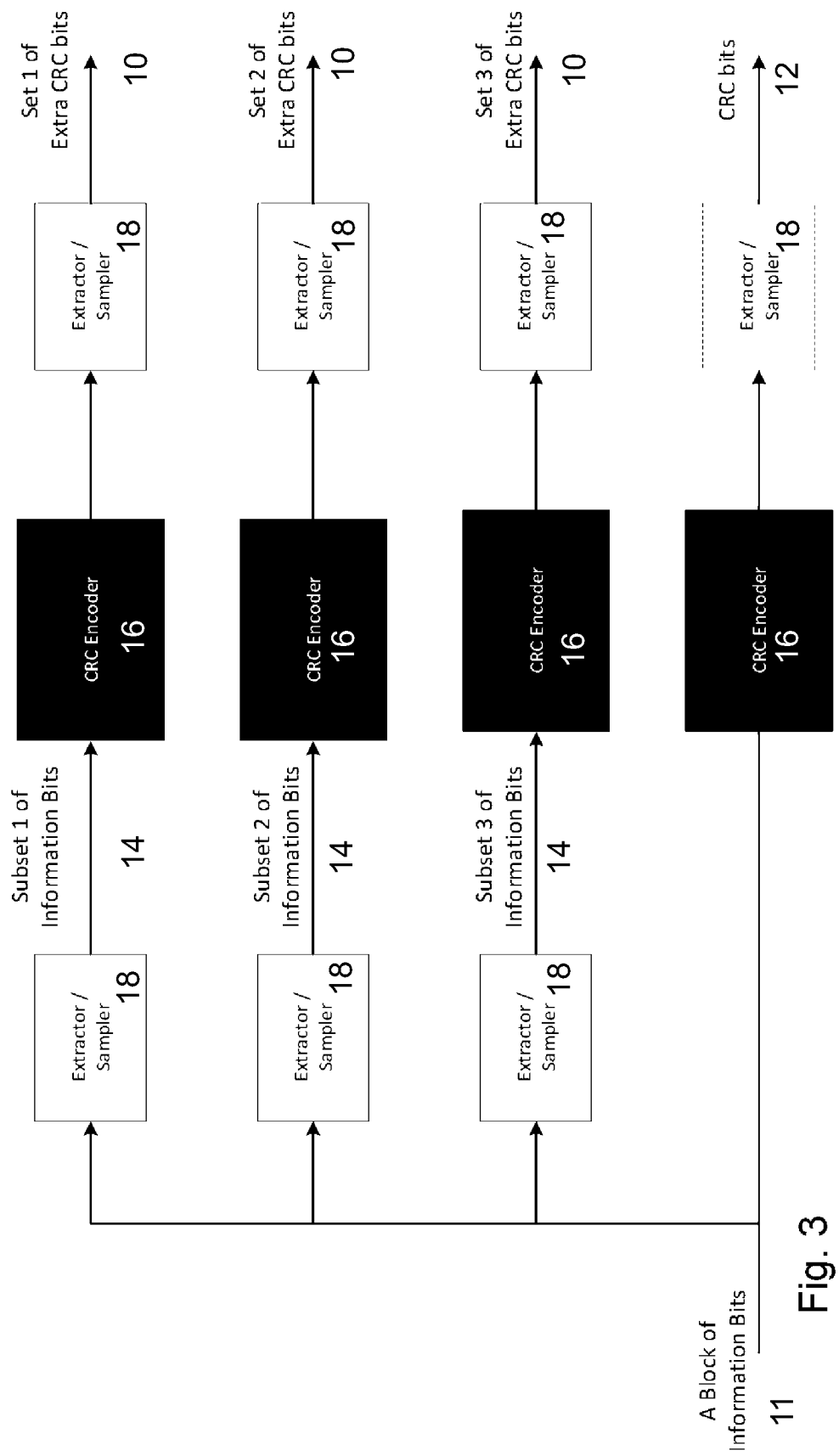
FIG. 3 is a block diagram illustrating an example non-recursive CRC encoder structure, according to some embodiments.

FIG. 3 is a block diagram illustrating an example non-recursive CRC encoder structure, according to some embodiments. The illustrated example includes three sets of extra CRC code bits 10 in addition to the original CRC code bits 12 normally generated by a given CRC polynomial Note that all CRC encoders 16 in the figure use the same CRC polynomial, but the extractors/samplers 18 are different for different CRC encoders 16 to draw different (ordered) subsets 14 from the block of information bits 11 before CRC encoding and from the CRC code bits after CRC encoding.

According to some embodiments, the last set of CRC bits are generated by taking all $c_0$ CRC bits generated by the CRC polynomial of degree $c_0$, as illustrated in FIG. 3 where the dotted box indicates that the extractor/sampler may be omitted. In this case, the overall set of CRC code bits always contains the complete set of the normal CRC code bits generated by the given CRC polynomial per conventional CRC computation (as described in the lowest branch in FIG. 3).

Figure 4:
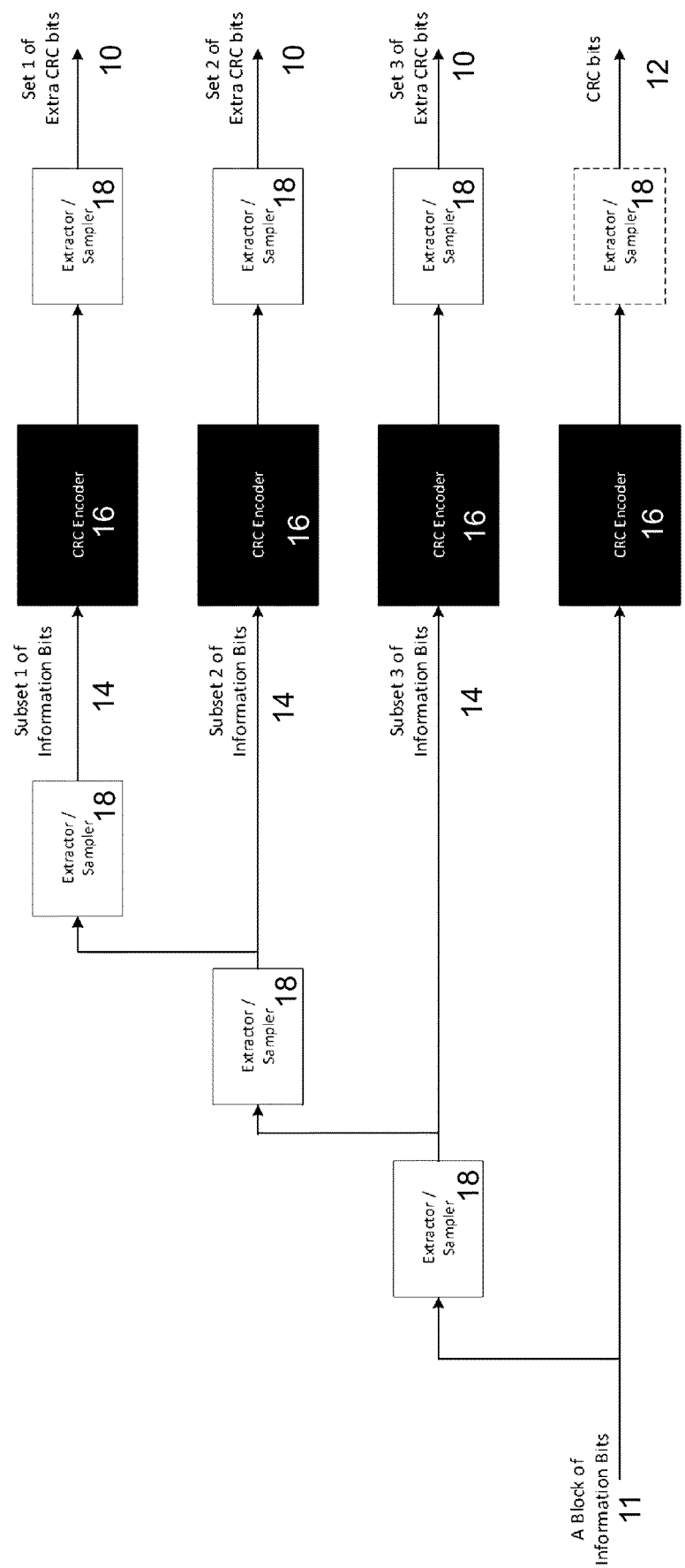
FIG. 4 is a block diagram illustrating an example non-recursive CRC encoder structure for a nested sequence of subsets of information bits, according to some embodiments.

According to some embodiments, the selected subsets $\{I_t\}_{t=1}^T$ of information bits satisfy a nested property, i.e.

$$I_1 \subset I_2 \subset I_3 \subset \ldots \subset I_T \subset I \quad (1)$$

and each $I_t$ contains consecutive information bits starting from the first information bit $b_0$, i.e. $I_t=(b_0, b_1, \ldots, b_{K_t-1})$ for $t \in \{1,2,\,,\,,\,T\}$ and $K_1 \leq K_2 \leq \ldots \leq K_T$. Each constant $K_i$ may be pre-selected according to some predefined target ratio $K_i/K$ that yields the desired effect in early termination and its associated reduction in average decoding latency. FIG. 4 illustrates an encoder structure for this special case.

FIG. 4 is a block diagram illustrating an example non-recursive CRC encoder structure for a nested sequence of subsets of information bits, according to some embodiments. In particular embodiments, the encoder may be efficiently implemented using shift registers and taking intermediate values in the shift registers as extra CRC bits 10. In other words, leveraging the nested sequence of subsets of information bits, the four conceptual CRC encoders 16 illustrated in FIG. 4 may be implemented by a single CRC encoder using shift registers. The different sets of extra CRC bits 10 are simply intermediate values taken out at different stages of running the same CRC encoder. An example of the shift register based CRC encoder implementation is illustrated in FIG. 5.

Figure 5:
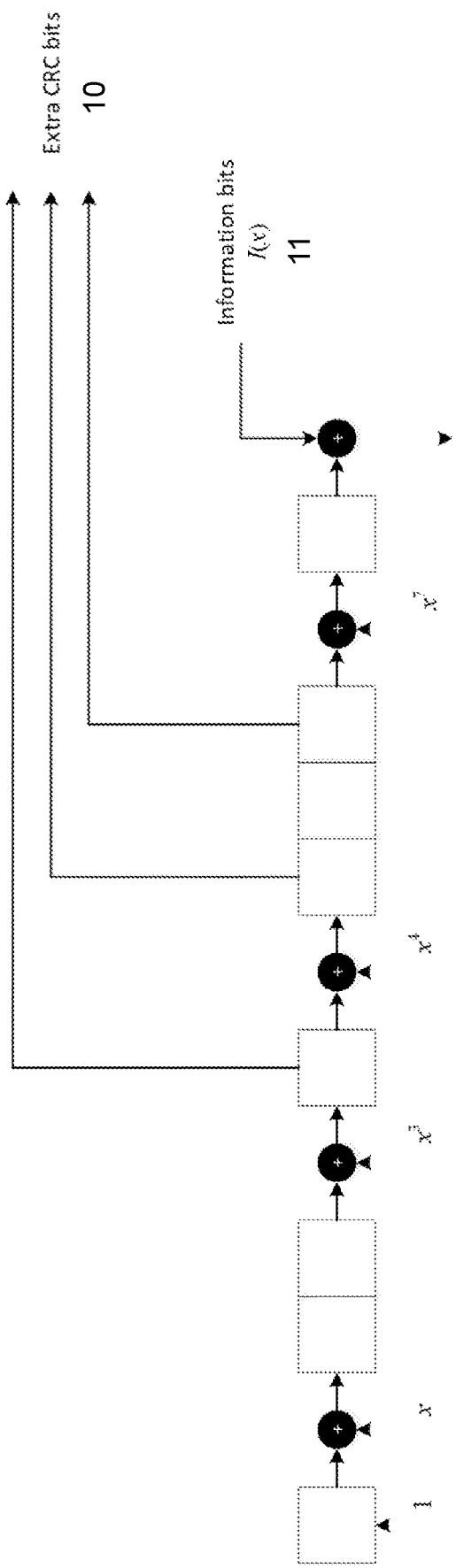
FIG. 5 is a block diagram illustrating an example shift register implementation of a non-recursive CRC encoder structure for a nested sequence of subsets of information bits, according to some embodiments.

FIG. 5 is a block diagram illustrating an example shift register implementation of a non-recursive CRC encoder structure for a nested sequence of subsets of information bits, according to some embodiments. For an exemplified 8-bit CRC polynomial:

$$p_{CRC}(x) = x^8 + x^7 + x^4 + x^3 + x + 1,$$

and $c'=3$ extra CRC bits with $c_i=1$ for all $i \in \{1,2,3\}$. The adders in the figure are the modulo-2 adder or, equivalently, the XOR operator. Each of the 3 extra CRC bits is taken from the intermediate values of the shift register at different stages of the encoding (or bit-shifting) process.

In one example, the first extra CRC bit is generated using information bits $I_1=(b_0, b_1, \ldots, b_{\lceil f_1 K \rceil-1})$, the second extra CRC bit is generated using information bits $I_2=(b_0, b_1, \ldots, b_{\lceil f_2 K \rceil-1})$, the third extra CRC bit is generated using information bits $I_3=(b_0, b_1, \ldots, b_{\lceil f_3 K \rceil-1})$, where $f_1$, $f_2$, and $f_3$ indicate fractions of the total number information bits to take, $0 < f_1 < f_2 < f_3 < 1$. In FIG. 5, only one CRC extra bit is taken out from the intermediate value of one shift register at a time (i.e., only one of the three lines for extra CRC bits in FIG. 5 is active at a time) after $\lceil f_i K \rceil$ information bits have been fed into the adder, for each i=1,2,3.

In another example, the first extra CRC bit is generated using information bits $I_1=(b_0, b_1, \ldots, b_{k_1-1})$, the second extra CRC bit is generated using information bits $I_2=(b_0, b_1, \ldots, b_{k_2-1})$, the third extra CRC bit is generated using information bits $I_3=(b_0, b_1, \ldots, b_{k_3-1})$, where $k_1$, $k_2$, and $k_3$ are integer constants, $0 < k_1 < k_2 < k_3 < K$. Only one CRC extra bit is taken out from the intermediate value of one shift register at a time (i.e., only one of the three lines for extra CRC bits in FIG. 5 is active at a time) after $k_i$ information bits have been fed into the adder, for each i=1,2,3.

For the same 8-bit CRC polynomial, $c'=6$ extra CRC bits with $c_i=1$ for all $i \in \{1,2,3,4,5,6\}$. Each of the 6 extra CRC bits is taken from the intermediate values of the shift register bits at different stages of the encoding (or bit-shifting) process. In one example, the first extra CRC bit is generated using information bits $I_1=(b_0, b_1, \ldots, b_{\lceil f_1 K \rceil-1})$, the second extra CRC bit is generated using information bits $I_2=(b_0, b_1, \ldots, b_{\lceil f_2 K \rceil-1})$, so forth, and at last, the sixth extra CRC bit is generated using information bits $I_3=(b_0, b_1, \ldots, b_{\lceil f_6 K \rceil-1})$, where $f_1, f_2, \ldots, f_6$ indicate fractions of the total number information bits to take, $0 < f_1 < f_2 < \ldots < f_6 < 1$. Only one CRC extra bit is taken out from the intermediate value of one shift register after $\lceil f_i K \rceil$ information bits have been fed into the adder, for each i=1,2,3,4,5,6.

In another example, the first extra CRC bit is generated using information bits $I_1=(b_0, b_1, \ldots, b_{k_1-1})$, the second extra CRC bit is generated using information bits $I_2=(b_0, b_1, \ldots, b_{k_2-1})$, so forth, and at last, the sixth extra CRC bit is generated using information bits $I_6=(b_0, b_1, \ldots, b_{k_6-1})$ where $k_1, k_2, \ldots, k_6$ are integer constants, $0 < k_1 < k_2 < \ldots < k_6 < K$. Only one CRC extra bit is taken out from the intermediate value of one shift register at a time after $k_i$ information bits have been fed into the adder, for each i=1,2,3,4,5,6.

The normal $c_0=8$ CRC bits are taken from the final values in the shift registers after all the information bits $I_0$ are fed into the encoder. The normal CRC bits are not counted as extra CRC bits.

In the recursive embodiments, the extra CRC code bits are generated recursively, which means that CRC bits generated later are computed using the values of the CRC bits generated earlier as input along with other information bits. An example is illustrated in FIG. 6.

Figure 6:
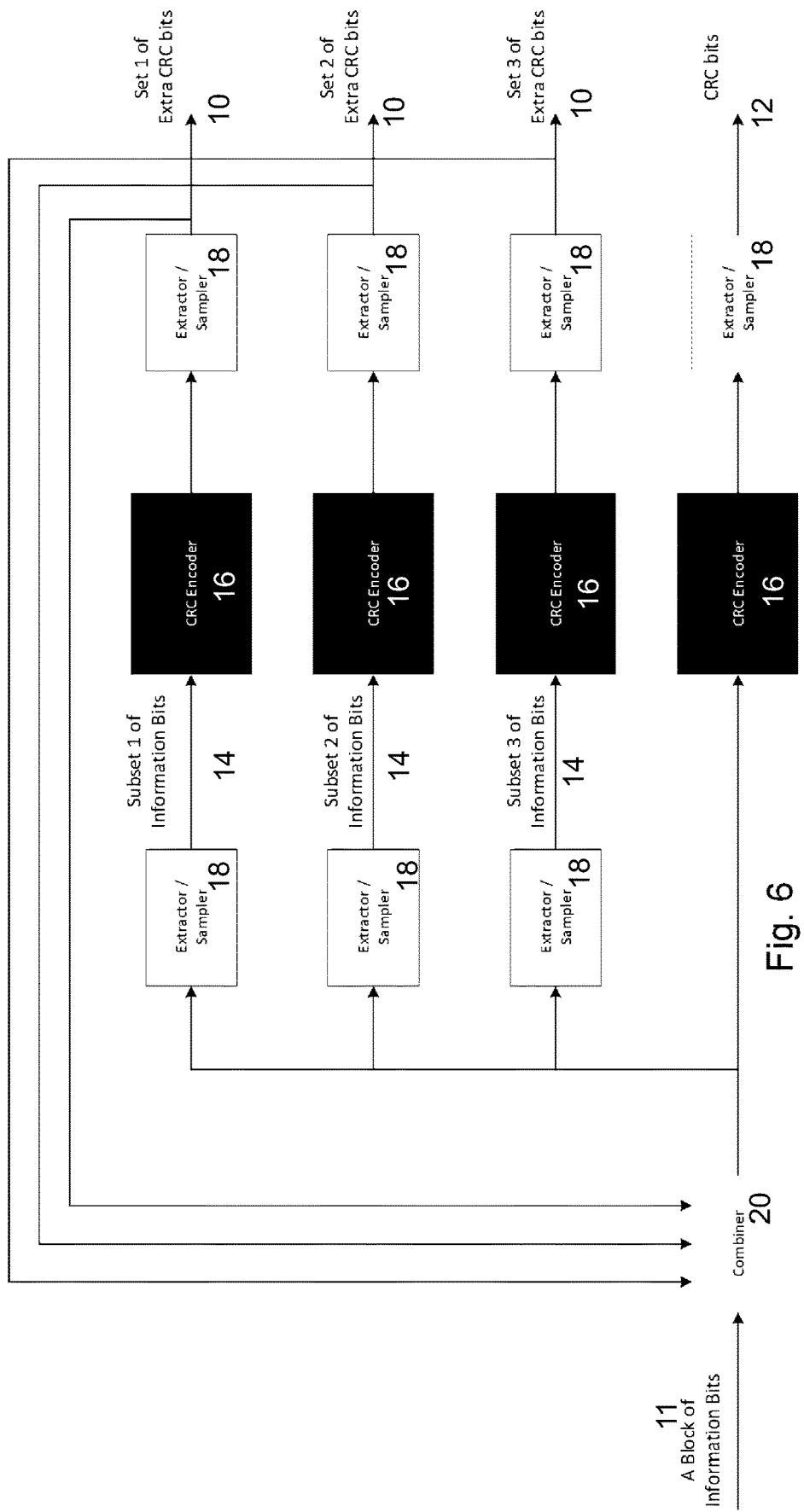
FIG. 6 is a block diagram illustrating an example recursive CRC encoder structure, according to some embodiments.

FIG. 6 is a block diagram illustrating an example recursive CRC encoder structure, according to some embodiments. The illustrated example includes an encoder structure for an example case with three sets of extra CRC code bits 10 in addition to the original CRC code bits 12 normally generated by a given CRC polynomial where each set of extra CRC bits 10 is re-inserted into the block of information bits 11 through combiner 20 so that they are re-encoded during the generation of the next set of CRC bits. Note that all CRC encoders 16 in the figure may use the same CRC polynomial, but the extractors/samplers 18 are different for different CRC encoders 16 to draw different (ordered) subsets from the block of information bits 14 before CRC encoding and from the CRC code bits after CRC encoding For clarity of explanation, FIG. 6 illustrates several CRC encoders 16, however, in some embodiments one CRC encoder is sufficient to fulfill the intended functionalities. For example, if the CRC encoder input sequences are nested according to nested property (1) described above, then the four CRC encoders illustrated in FIG. 6 may be implemented by a single CRC encoder using shift registers. The different sets of extra CRC bits are simply intermediate values taken out at different stages of running the same CRC encoder.

According to some embodiments, the last (or final) set of CRC bits may be generated by taking all $c_0$ CRC bits generated by the CRC polynomial of degree $c_0$, as illustrated in FIG. 6 where the dotted box indicates that the extractor/sampler may be omitted. In this case, the overall set of CRC code bits always contains the complete set of the normal CRC code bits generated by the given CRC polynomial per conventional CRC computation (as described in the lowest branch in FIG. 6).

According to some embodiments, the selected subsets $\{I_t\}_{t=1}^{T}$ of information bits satisfy the nested property (1) and each $I_t$ contains consecutive information bits starting from the first information bit $b_0$. The encoder structure of this special case is illustrated in FIG. 7.

Figure 7:
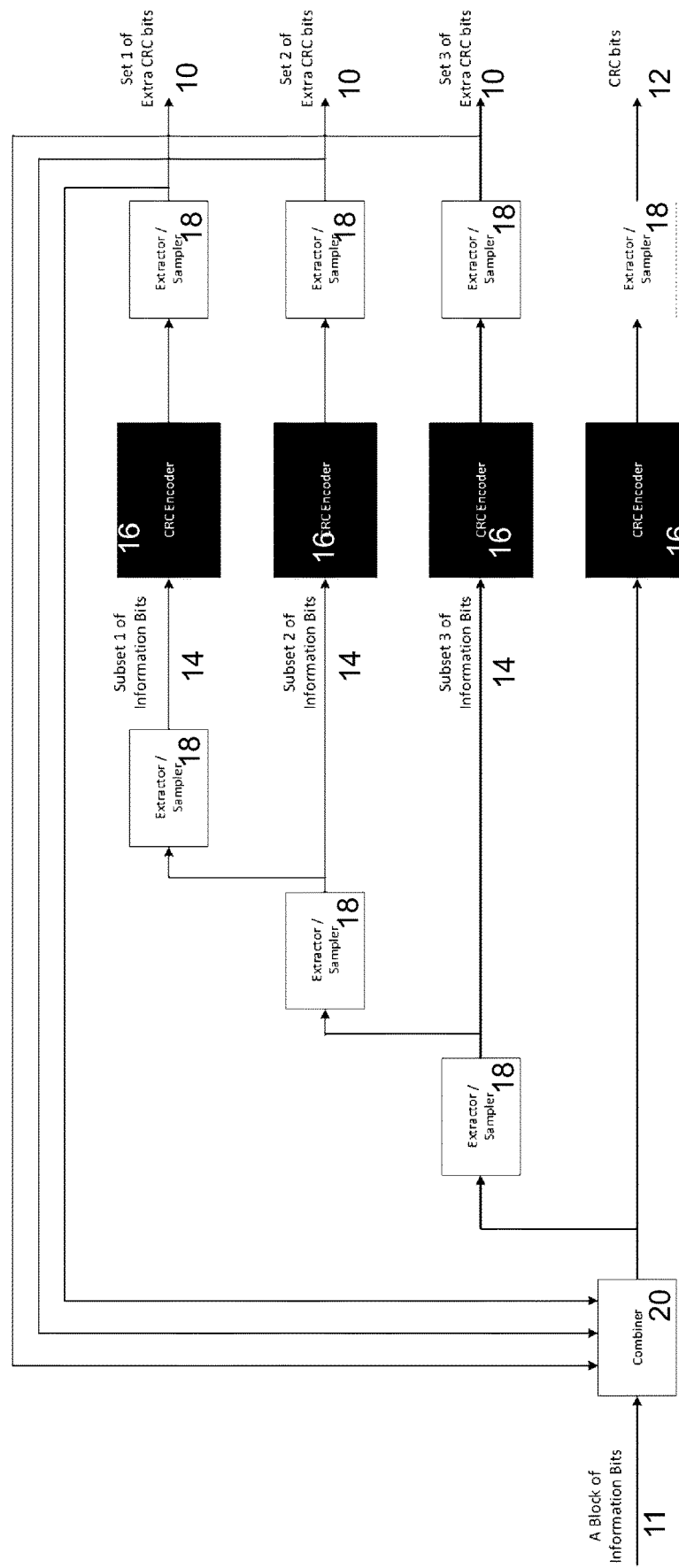
FIG. 7 is a block diagram illustrating an example recursive CRC encoder structure for a nested sequence of subsets of information bits, according to some embodiments.

FIG. 7 is a block diagram illustrating an example recursive CRC encoder structure for a nested sequence of subsets of information bits, according to some embodiments. Each set of extra CRC bits 10 are re-inserted into the block of information bits through combiner 20 so that they are re-encoded during the generation of the next set of CRC bits 10.

In some embodiments, the encoder may be efficiently implemented using shift registers and taking intermediate values in the shift registers as extra CRC bits. An example is illustrated in FIG. 8.

Figure 8:
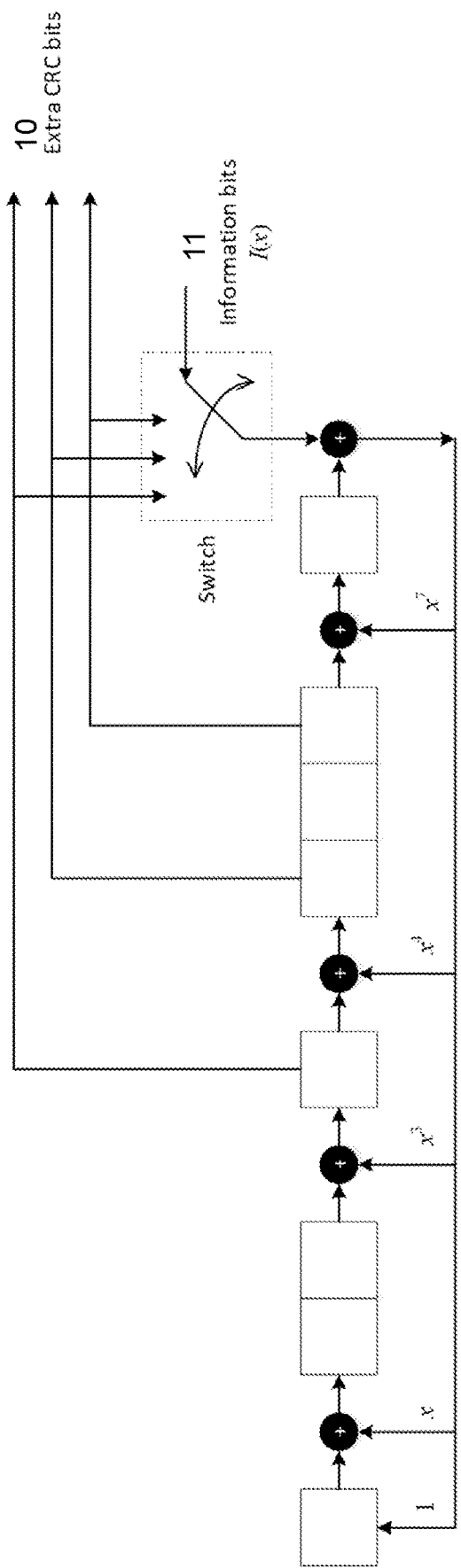
FIG. 8 is a block diagram illustrating an example shift register implementation of a recursive CRC encoder structure for a nested sequence of subsets of information bits, according to some embodiments.

FIG. 8 is a block diagram illustrating an example shift register implementation of a recursive CRC encoder structure for a nested sequence of subsets of information bits, according to some embodiments. For an example 8-bit CRC polynomial:

$$p_{CRC}(x)=x^8+x^7+x^4+x^3+x+1,$$

and c'=3 extra CRC bits with $c_i=1$ for all $i \in \{1,2,3\}$. Each of the 3 extra CRC bits is taken from the intermediate values of the shift register at different stages of the encoding (or bit-shifting) process.

In one example, the first extra CRC bit is generated using information bits $I_1=(b_0, b_1, \ldots, b_{\lceil f_1 K \rceil-1})$, the second extra CRC bit is generated using information bits $I_2=(b_0, b_1, \ldots, b_{\lceil f_2 K \rceil-1})$ together with the first extra CRC bit, the third extra CRC bit is generated using information bits $I_3=(b_0, b_1, \ldots, b_{\lceil f_3 K \rceil-1})$ together with the first and second extra CRC bit, where f1, f2, and f3 indicate fractions of the total number information bits to take, $0<f_1<f_2<f_3<1$. In FIG. 8, only one CRC extra bit is taken out from the intermediate value of one shift register at a time (i.e., only one of the 3 lines for extra CRC bits in FIG. 8 is active at a time) after $\lceil f_i K \rceil$ information bits have been fed into the adder, for each i=1,2,3.

In another example, the first extra CRC bit is generated using information bits $I_1=(b_0, b_1, \ldots, b_{k_1-1})$, the second extra CRC bit is generated using information bits $I_2=(b_0, b_1, \ldots, b_{k_2-1})$ together with the first extra CRC bit, the third extra CRC bit is generated using information bits $I_3=(b_0, b_1, \ldots, b_{k_3-1})$ together with the first and the second extra CRC bit, where $k_1$, $k_2$, and $k_3$ are integer constants, $0<k_1<k_2<k_3<K$. Only one CRC extra bit is taken out from the intermediate value of one shift register at a time (i.e., only one of the 3 lines for extra CRC bits in FIG. 8 is active at a time) after $k_i$ information bits have been fed into the adder, for each i=1,2,3.

For the same 8-bit CRC polynomial, c'=6 extra CRC bits with $c_i=1$ for all $i \in \{1,2,3,4,5,6\}$. Each of the 6 extra CRC bits is taken from the intermediate values of the shift register at different stages of the encoding (or bit-shifting) process. In one example, the first extra CRC bit is generated using information bits $I_1=(b_0, b_1, \ldots, b_{\lceil f_1 K \rceil-1})$, the second extra CRC bit is generated using information bits $I_2=(b_0, b_1, \ldots, b_{\lceil f_2 K \rceil-1})$ together with the first extra CRC bit, . . . , the sixth extra CRC bit is generated using information bits $I_3=(b_0, b_1, \ldots, b_{\lceil f_6 K \rceil-1})$ together with the first through fifth extra CRC bit, where f1, f2, . . . f6 indicate fractions of the total number information bits to take, $0<f1<f2<\ldots<f6<1$. Only one CRC extra bit is taken out from the intermediate value of one shift register after $\lceil f_i K \rceil$ information bits have been fed into the adder, for each i=1,2,3,4,5,6.

In another example, the first extra CRC bit is generated using information bits $I_1=(b_0, b_1, \ldots, b_{k_1-1})$, the second extra CRC bit is generated using information bits $I_2=(b_0, b_1, \ldots, b_{k_2-1})$ together with the first extra CRC bit, . . . , the sixth extra CRC bit is generated using information bits $I_6=(b_0, b_1, \ldots, b_{k_6-1})$ together with the first through fifth extra CRC bit, where $k_1, k_2, \ldots, k_6$ are integer constants, $0<k_1<k_2<\ldots<k_6<K$. Only one CRC extra bit is taken out from the intermediate value of one shift register at a time after $k_i$ information bits have been fed into the adder, for each i=1,2,3,4,5,6.

The normal $c_0=8$ CRC bits are taken from the final values in the shift registers after all the information bits $I_0$ and all the extra CRC bits are fed into the encoder. The normal CRC bits are not counted as extra CRC bits. As illustrated in FIG. 8, the extra CRC bits are re-inserted into the stream of information bits as input to the shift registers using possibly a switch, so that the subsequently generated extra CRC bits are also computed based on the previously generated CRC bits as well as the information bits.

In general, the first extra CRC bits are generated by encoding a subset $I_1 \subset I$ of information bits using the same CRC polynomial $p_{CRC}(x)$, and extract bits that are readily available at the intermediate CRC encoding stage. A similar method applies to the other extra CRC bits.

While the above embodiments assume that the first extra CRC bits took a subset of the coefficients $R_1=(R_0^{(1)}, R_1^{(1)}, \ldots, R_{c_0-1}^{(1)})$, in general, however, this is not the only design choice. Other embodiments are possible as described in the alternatives below. In the following, the first subset of information bits $I_1$ is used as an example in discussion, while the same method applies to other subsets of the information bits.

In some embodiments, the extra CRC bits are shift register values of the CRC encoder, but is not a subset of $R_1$. This may happen depending on the CRC encoder construction.

In some embodiments, the extra CRC bits are a function of the shift register values of CRC encoder, where the shift register values may or may not equal to $R_1=(R_0^{(1)}, R_1^{(1)}, \ldots, R_{c_0-1}^{(1)})$ but instead, function of $R_1=(R_0^{(1)}, R_1^{(1)}, \ldots, R_{c_0-1}^{(1)})$. For example, two extra CRC bits $\{V_1, V_2\}$ can be generated from the first subset of information bits $I_1$ by: $V_1=R_0^{(1)}+R_2^{(1)}$, and $V_2=R_1^{(1)}+R_2^{(1)}+R_4^{(1)}$.

The extra CRC bits can be placed in several manners, relative to the information bits, at the input of polar encoder. In some embodiments, the extra CRC bits are distributed among the information bits. In a particular embodiment, subset of size $c_1$ CRC bits are located right after the subset $I_1$ of information bits, and subset of size $c_2$ CRC bits are located right after the subset $I_2$ of information bits, etc. This facilitates the extra CRC bits being used for either of the following purposes in the polar decoder.

A first purpose is early termination of the decoder. For example, when the decoder reaches the $c_1$ CRC bits, and no candidate paths up to this point satisfies the $c_1$ CRC bits, then the decoder can stop without processing the rest of information and frozen bits.

A second purpose is path selection in the decoder. For example, when the decoder reaches the $c_1$ CRC bits, the decoder can check all the candidate paths up to this point, and only keep those that satisfy the $c_1$ CRC bits as surviving paths in subsequent decoding steps.

In some embodiments, the extra CRC bits are collected as one group of consecutive bits. For example, they are collected and put behind the information bits as a group. In these embodiments, the CRC bits are localized, rather than distributed. A particular benefit of these embodiments is generating a longer set of CRC bits compared to what is naturally available from the CRC polynomial $p_{CRC}(x)$. For example, these embodiments may generate 19 CRC bits using a 16-bit CRC polynomial, or generate 14 CRC bits using an 8-bit CRC polynomial.

In general, the embodiments described above generate extra CRC bits by encoding subsets of information bits using the same CRC polynomial and extract some of the resulting CRC bits as the extra CRC bits. When the sequence of subsets of information bits is nested (i.e., each subset contains and when each subset always contains consecutive information bits from the first information bit), the process of generating the extra CRC bits can simply be extracted from the intermediate results during the CRC encoding or decoding process so that very little increase in complexity is incurred. The last subset contains all the information bits.

Embodiments include non-recursive and recursive embodiments. In the non-recursive embodiments, the extra CRC code bits are generated non-recursively, which means that CRC bits generated later are not computed using the values of the CRC bits generated earlier as input. In the recursive embodiments, the extra CRC code bits are generated recursively, which means that CRC bits generated later are computed using the values of the CRC bits generated earlier as input along with other information bits.

Figure 9:
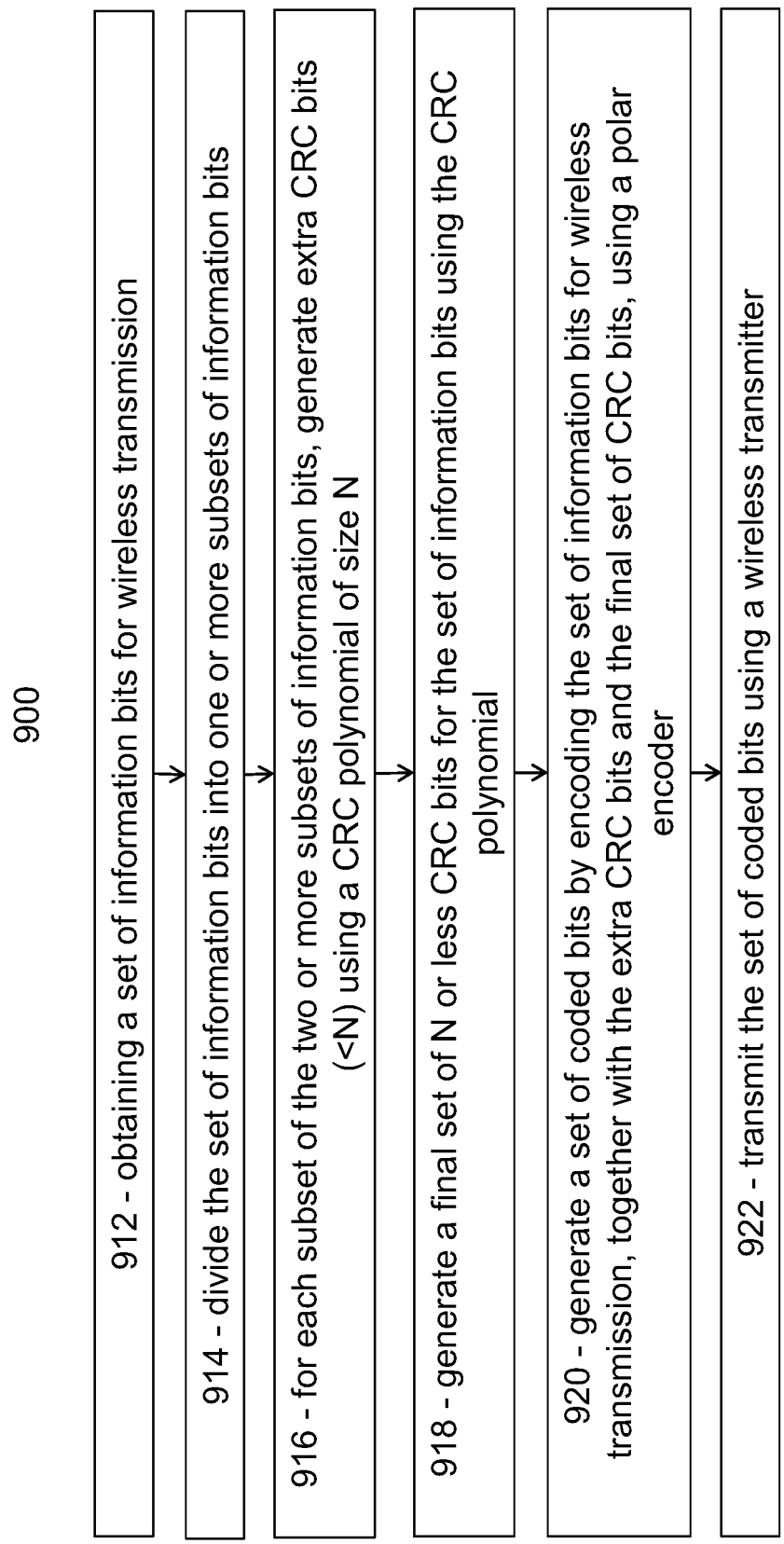
FIG. 9 is a flow diagram illustrating an example method in a wireless transmitter, according to some embodiments.
Figure 10:
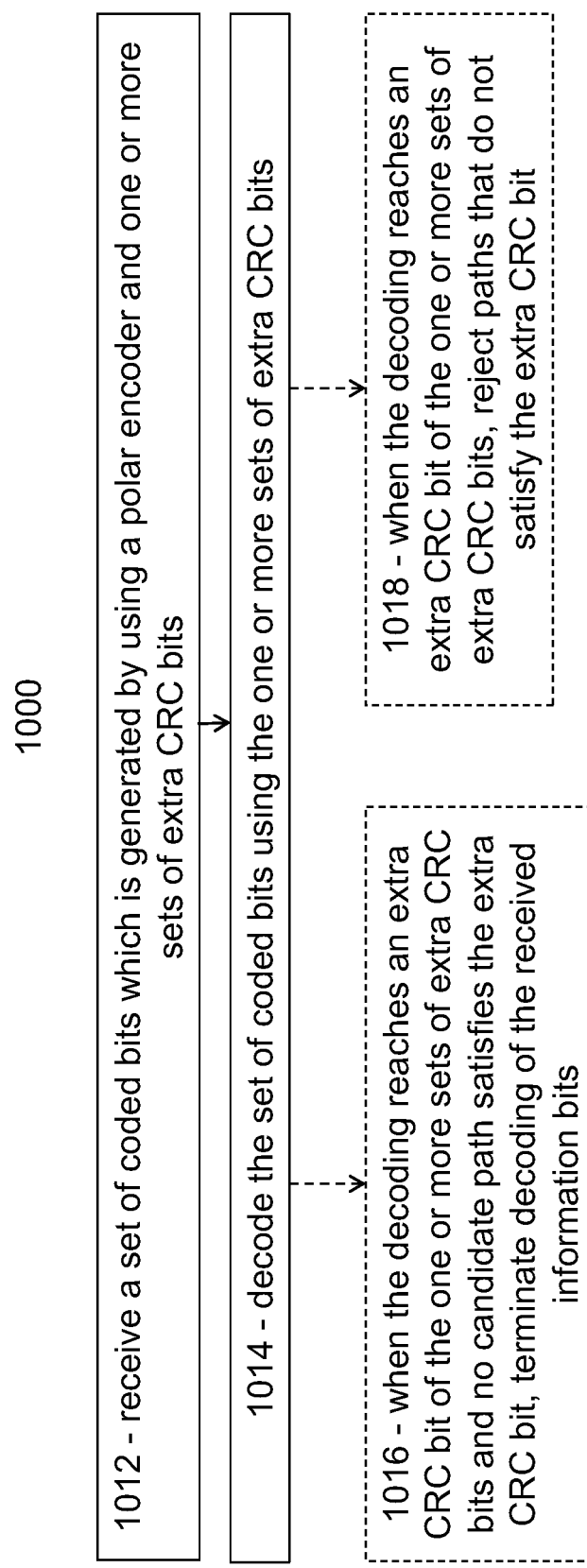
FIG. 10 is a flow diagram illustrating an example method in a wireless receiver, according to some embodiments.

The examples described above may be generally represented by the flowcharts in FIG. 9 (with respect to a transmitter, such as network node 120 or wireless device 110) and FIG. 10 (with respect to a receiver, such as wireless device 110 or network node 120).

FIG. 9 is a flow diagram illustrating an example method in a wireless transmitter, according to some embodiments. In particular embodiments, one or more steps of FIG. 9 may be performed by network elements (e.g., network node 120, wireless device 110, etc.) of network 100 described with respect to FIG. 2.

The method begins at step 912, where the wireless transmitter obtains a set of information bits for wireless transmission. For example, network node 120 may obtain information bits from a higher layer for wireless transmission to wireless device 110. The set of bits may range from a few bits (e.g., 5, 10) up to hundreds of bits or more.

At step 914, the network node divides the set of information bits into one or more subsets of information bits. For example, network node 120 may divide the information bits into nested subsets of information bits (i.e., each successive subset includes the information bits from a previous subset) or may divide to separate subsets of information bits (i.e., each subset includes different information bits than the other subsets) according to any of the examples and embodiments described with respect to FIGS. 3-8, 13 and 14.

At step 916, for each subset of the one or more subsets of information bits, the network node generates extra CRC bits using a CRC polynomial. For example, network node 120 may generate extra CRC bits using a CRC polynomial capable of generating N CRC bits. The extra CRC bits for each subset of information bits comprise less than N CRC bits.

The wireless transmitter may generate extra CRC bits according to any of the examples and embodiments described with respect to FIGS. 3-8, 13 and 14 (e.g., recursive, non-recursive, etc.). In some embodiments, network node 120 may use a shift register and/or a combiner to generate extra CRC bits.

At step 918, the wireless transmitter generates a final (last, overall) set of CRC bits for the set of information bits using the CRC polynomial. For example, network node 120 may generate CRC bits for the information bits using the same CRC polynomial as in step 916.

At step 920, the network node generates a set of coded bits by encoding the set of information bits for wireless transmission, together with the extra CRC bits and the final set of CRC bits, using a polar encoder. For example, network node 120 may encode the information bits according to any of the examples and embodiments described with respect to FIGS. 3-8, 13 and 14. For example, network node 120 may insert the extra CRC bits for each subset of information bits after its corresponding subset of information bits, or network node 120 may insert the extra CRC bits for each subset of information bits as a group after the set of information bits.

The particular size of each subset and number of extra CRC bits associated with each subset may vary. In some embodiments, A number of extra CRC bits for each successive subset of the one or more subsets of information bits may be greater than or equal to a number of extra CRC bits for a previous subset of the one or more subsets of information bits. For example, using nested subsets, a first subset may include the first 10 bits of the information bits and be associated with a single extra CRC bit. A second subset may include the first 20 bits of the information bits (and first extra CRC bit if recursive generation is used) and be associated with two extra CRC bits. A third subset may include the first 50 bits of the information bits (and first and second extra CRC bits if recursive generation is used) and be associated with four extra CRC bits, and so on. Particular embodiments may choose any suitable subset size and number of associated extra CRC bits.

At step 922, the wireless transmitter transmits the set of coded bits using a wireless transmitter. For example, network node 120 may transmit the encoded set of information bits to wireless device 110.

Modifications, additions, or omissions may be made to method 900. Additionally, one or more steps in method 900 of FIG. 9 may be performed in parallel or in any suitable order. The steps of method 900 may be repeated over time as necessary.

FIG. 10 is a flow diagram illustrating an example method in a wireless receiver, according to some embodiments. In particular embodiments, one or more steps of FIG. 10 may be performed by network elements (e.g., wireless device 110, network node 120, etc.) of network 100 described with respect to FIG. 2.

The method begins at step 1012, where a wireless receiver receives a set of coded bits which were generated by using a polar encoder and one or more sets of extra CRC bits. For example, wireless device 110 may receive a set of coded bits from network node 120. The extra CRC bits may have been generated by dividing a set of information bits into one or more subsets of information bits and, for each subset of the one or more subsets of information bits, generating extra CRC bits using a CRC polynomial (see FIG. 9 as an example).

At step 1014, the wireless receiver decodes the encoded set of information bits using the one or more sets of extra CRC bits. For example, wireless device 110 may decode the received information bits using polar codes and the set of extra CRC bits according to any of the embodiments and examples described herein, such as with respect to FIGS.

3-8, 13 and 14. The extra CRC bits may be used for more efficient decoding. For example, the extra CRC bits may be used in the following steps.

When the decoding reaches an extra CRC bit of the one or more sets of extra CRC bits and no candidate path satisfies the extra CRC bit, the method continues to step 1016. At step 1016, the wireless receiver (e.g., wireless device 100) terminates decoding of the received information bits. A particular advantage is that decoding may be terminated, and an erred transmission may be detected prior to decoding the entire transmission.

When the decoding reaches an extra CRC bit of the one or more sets of extra CRC bits, the method continues to step 1018. At step 1018, the wireless receiver (e.g., wireless device 100) rejects paths that do not satisfy the extra CRC bit. For example, wireless device 110 using an SCL decoder may reject paths earlier in the decoding process, which leads to more efficient decoding.

Modifications, additions, or omissions may be made to method 1000. Additionally, one or more steps in method 1000 of FIG. 10 may be performed in parallel or in any suitable order. The steps of method 1000 may be repeated over time as necessary.

Figure 11B:
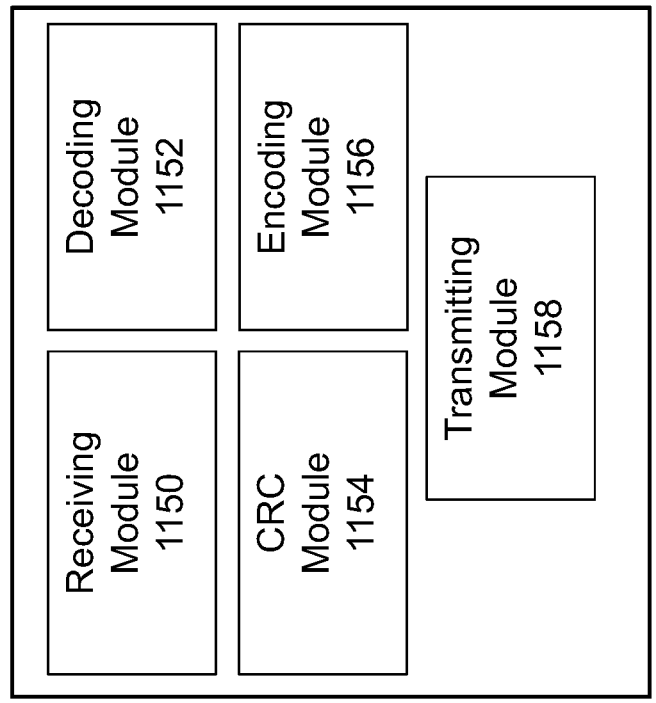
FIG. 11B is a block diagram illustrating example components of a wireless device.
Figure 11A:
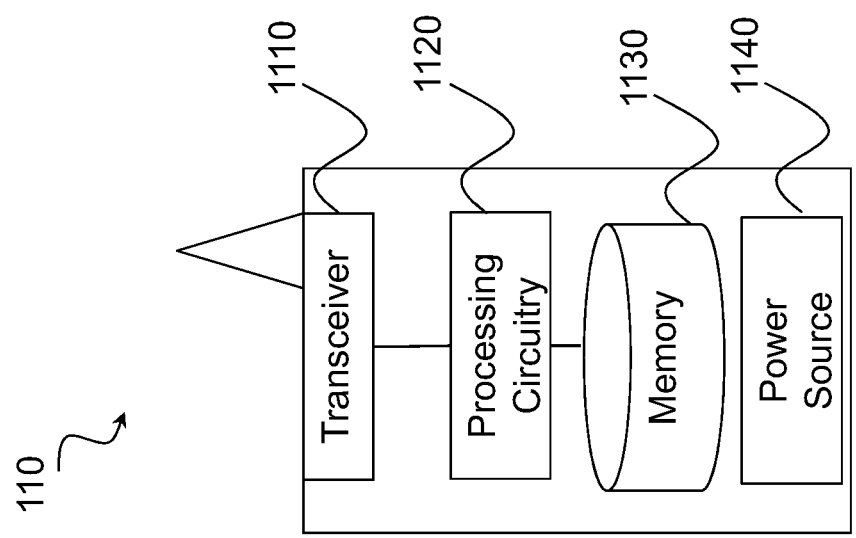
FIG. 11A is a block diagram illustrating an example embodiment of a wireless device.

FIG. 11A is a block diagram illustrating an example embodiment of a wireless device. The wireless device is an example of the wireless devices 110 illustrated in FIG. 2. In particular embodiments, the wireless device is capable of polar encoding and decoding information bits using extra CRC bits all generated from the same CRC polynomial according to any of the examples and embodiments described with respect to FIGS. 3-10, 13 and 14.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 1110, processor or processing circuitry 1120, memory 1130, and power source 1140. In some embodiments, transceiver 1110 facilitates transmitting wireless signals to and receiving wireless signals from wireless network node 120 (e.g., via an antenna), processing circuitry 1120 executes instructions to provide some or all of the functionality described herein as provided by the wireless device, and memory 1130 stores the instructions executed by processing circuitry 1120. Power source 1140 supplies electrical power to one or more of the components of wireless device 110, such as transceiver 1110, processing circuitry 1120, and/or memory 1130.

Processing circuitry 1120 includes any suitable combination of hardware and software implemented in one or more integrated circuits or modules to execute instructions and manipulate data to perform some or all of the described functions of the wireless device. In some embodiments, processing circuitry 1120 may include, for example, one or more computers, one more programmable logic devices, one or more central processing units (CPUs), one or more microprocessors, one or more applications, and/or other logic, and/or any suitable combination of the preceding. Processing circuitry 1120 may include analog and/or digital circuitry configured to perform some or all of the described functions of wireless device 110. For example, processing circuitry 1120 may include resistors, capacitors, inductors, transistors, diodes, and/or any other suitable circuit components.

Memory 1130 is generally operable to store computer executable code and data. Examples of memory 1130 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 1140 is generally operable to supply electrical power to the components of wireless device 110. Power source 1140 may include any suitable type of battery, such as lithium-ion, lithium-air, lithium polymer, nickel cadmium, nickel metal hydride, or any other suitable type of battery for supplying power to a wireless device. Other embodiments of the wireless device may include additional components (beyond those shown in FIG. 11A) responsible for providing certain aspects of the wireless device's functionality, including any of the functionality described above and/or any additional functionality (including any functionality necessary to support the solution described above).

FIG. 11B is a block diagram illustrating example components of a wireless device 110. The components may include receiving module 1150, decoding module 1152, CRC module 1154, encoding module 1156, and transmitting module 1158.

Receiving module 1150 may perform the obtaining and/or receiving functions of wireless device 10. For example, receiving module 1150 may obtain information bits from a higher layer for polar encoding and transmission. In some embodiments, receiving module 1150 may receive encoded information bits from network node 120. In certain embodiments, receiving module 1150 may include or be included in processing circuitry 1120. In particular embodiments, receiving module 1150 may communicate with decoding module 1152, CRC module 1154, encoding module 1156, and transmitting module 1158.

Decoding module 1152 may perform the decoding functions of wireless device 110. For example, decoding module 1152 may decode information bits polar encoded with extra CRC bits according to any of the examples and embodiments described herein. In certain embodiments, decoding module 1152 may include or be included in processing circuitry 1120. In particular embodiments, decoding module 1152 may communicate with receiving module 1150, CRC module 1154, encoding module 1156, and transmitting module 1158.

CRC module 1154 may perform the CRC functions of wireless device 110. For example, CRC module 1154 may generate CRC bits according to any of the examples and embodiments described herein. In certain embodiments, CRC module 1154 may include or be included in processing circuitry 1120. In particular embodiments, CRC module 1154 may communicate with receiving module 1150, decoding module 1152, encoding module 1156, and transmitting module 1158.

Encoding module 1156 may perform the encoding functions of wireless device 110. For example, encoding module 1156 may polar encode information bits and extra CRC bits according to any of the examples and embodiments described herein. In certain embodiments, encoding module 1156 may include or be included in processing circuitry 1120. In particular embodiments, encoding module 1156 may communicate with receiving module 1150, decoding module 1152, CRC module 1154, and transmitting module 1158.

Transmitting module 1158 may perform the transmitting functions of wireless device 110. For example, transmitting module 1158 may transmit information bits polar encoded with extra CRC bits. In certain embodiments, transmitting module 1158 may include or be included in processing circuitry 1120. In particular embodiments, transmitting module 1158 may communicate with decoding module 1152, CRC module 1154 and encoding module 1156.

FIG. 12A is a block diagram illustrating an example embodiment of a network node. The network node is an example of the network node 120 illustrated in FIG. 2. In particular embodiments, the network node is capable of polar encoding and decoding information bits using extra CRC bits all generated from the same CRC polynomial according to any of the examples and embodiments described with respect to FIGS. 3-10, 13 and 14.

Network node 120 can be an eNodeB, a nodeB, a gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 1210, processor or processing circuitry 1220, at least one memory 1230, and at least one network interface 1240. Transceiver 1210 facilitates transmitting wireless signals to and receiving wireless signals from a wireless device, such as wireless devices 110 (e.g., via an antenna); processing circuitry 1220 executes instructions to provide some or all of the functionality described above as being provided by a network node 120; memory 1230 stores the instructions executed by processing circuitry 1220; and network interface 1240 communicates signals to backend network components, such as a gateway, switch, router, Internet, Public Switched Telephone Network (PSTN), controller, and/or other network nodes 120. Processing circuitry 1220 and memory 1230 can be of the same types as described with respect to processing circuitry 1120 and memory 1130 of FIG. 11A above.

In some embodiments, network interface 1240 is communicatively coupled to processing circuitry 1220 and refers to any suitable device operable to receive input for network node 120, send output from network node 120, perform suitable processing of the input or output or both, communicate to other devices, or any combination of the preceding. Network interface 1240 includes appropriate hardware (e.g., port, modem, network interface card, etc.) and software, including protocol conversion and data processing capabilities, to communicate through a network.

Other embodiments of network node 120 include additional components (beyond those shown in FIG. 12A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

FIG. 12B is a block diagram illustrating example components of network node 120. The components may include receiving module 1250, decoding module 1252, CRC module 1254, encoding module 1256, and transmitting module 1258.

Receiving module 1250 may perform the receiving and/or obtaining functions of network node 120. For example, receiving module 1250 may obtain information bits from a higher layer for polar encoding and transmission. In some embodiments, receiving module 1250 may receive encoded information bits from wireless device 110. In certain embodiments, receiving module 1250 may include or be included in processing circuitry 1220. In particular embodiments, receiving module 1250 may communicate with decoding module 1252, CRC module 1254, encoding module 1256, and transmitting module 1258.

Decoding module 1252 may perform the decoding functions of network node 120. For example, decoding module 1252 may decode information bits polar encoded with extra CRC bits according to any of the examples and embodiments described herein. In certain embodiments, decoding module 1252 may include or be included in processing circuitry 1220. In particular embodiments, decoding module 1252 may communicate with receiving module 1250, CRC module 1254, encoding module 1256, and transmitting module 1258.

CRC module 1254 may perform the CRC functions of network node 120. For example, CRC module 1254 may generate CRC bits according to any of the examples and embodiments described herein. In certain embodiments, CRC module 1254 may include or be included in processing circuitry 1220. In particular embodiments, CRC module 1254 may communicate with receiving module 1250, decoding module 1252, encoding module 1256, and transmitting module 1258.

Encoding module 1256 may perform the encoding functions of network node 120. For example, encoding module 1256 may polar encode information bits and extra CRC bits according to any of the examples and embodiments described herein. In certain embodiments, encoding module 1256 may include or be included in processing circuitry 1220. In particular embodiments, encoding module 1256 may communicate with receiving module 1250, decoding module 1252, CRC module 1254, and transmitting module 1258.

Transmitting module 1258 may perform the transmitting functions of network node 120. For example, transmitting module 1258 may transmit information bits polar encoded with extra CRC bits. In certain embodiments, transmitting module 1258 may include or be included in processing circuitry 1220. In particular embodiments, transmitting module 1258 may communicate with decoding module 1252, CRC module 1254 and encoding module 1256.

Particular embodiments may include a generalization of the embodiments described above. For example, in particular embodiments the CRC encoders for extra CRC code bits may be generalized to include any type of linear block codes. Choices of linear block code, other than CRC codes, include: single-parity-check codes (SPC), Hamming codes, BCH codes, Golay codes, Reed-Muller codes and Reed-Solomon codes. Examples using a generic parity code check are illustrated in FIGS. 13 and 14.

Figure 13:
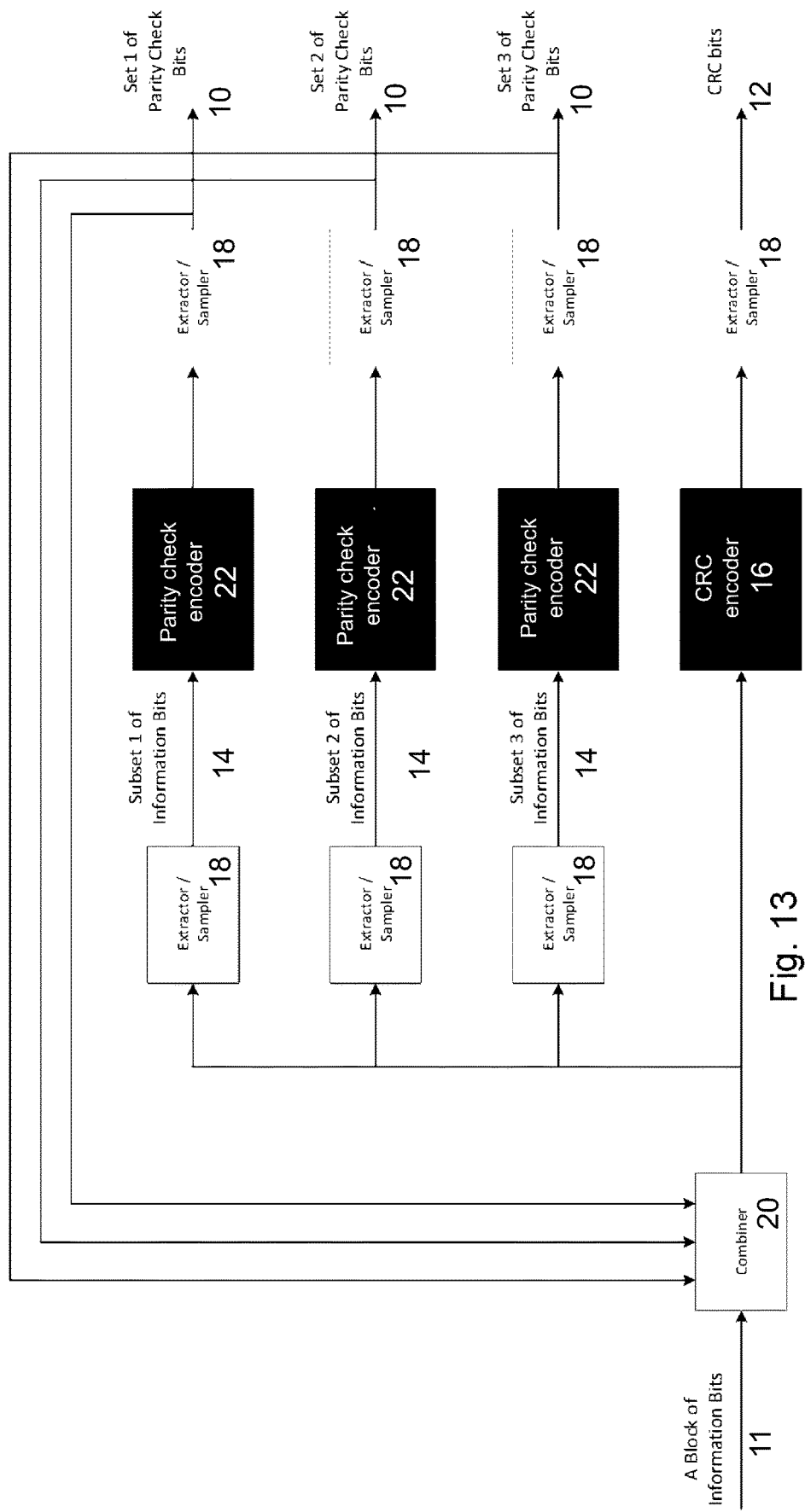
FIG. 13 is a block diagram illustrating an example recursive CRC encoder structure with parity-check and CRC encoders, according to some embodiments.
Figure 14:
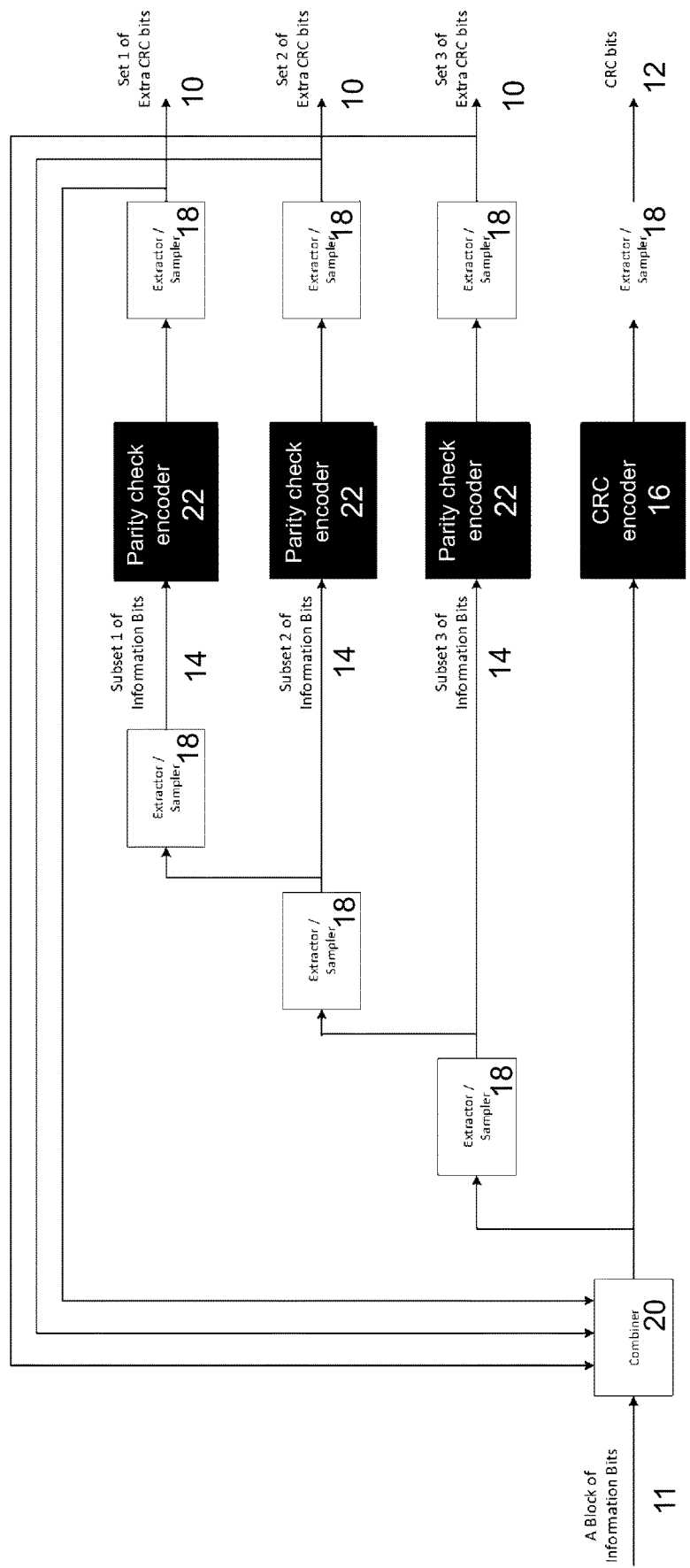
FIG. 14 is a block diagram illustrating an example recursive CRC encoder structure for a nested sequence of subsets of information bits with parity-check and CRC encoders, according to some embodiments.

FIG. 13 is a block diagram illustrating an example recursive CRC encoder structure with parity-check and CRC encoders, according to some embodiments. The illustrated example is similar to the example illustrated in FIG. 6, except for the CRC encoder used to generate the normal CRC code bits (lowest branch), all the CRC encoders may be replaced by encoders of a parity check code. Specifically, for each $t \in \{1, 2, \ldots, T\}$, a set of parity check bits $V_t = (V_0^{(t)}, V_1^{(t)}, \ldots, V_{c_t-1}^{(t)})$, may be computed by $$V_t = I \, E_{K, K_t} P_t \, E_{N_t, c_t}$$

where $I = (b_0, b_1, \ldots, b_{K-1})$ is the information block, $P_t$ is a $K_t$ by $N_t$ parity check matrix, and $E_{m,n}$ denotes an m-by-n extraction matrix (illustrated by the dotted boxes in the figure) with m>n, whose rows are the rows of a n by n identity matrix. The selected subset of information bits used to generate the parity check bits is denoted by $I_t = I E_{K,K_t}$.

The parity check matrix may be obtained from the parity check matrix of any systematic code, such as a single parity check code, a systematic convolutional code (e.g., another CRC code) or a systematic block code (e.g., systematic Reed-Muller code or Polar code). For an example with T=3, $c_t=1$, $I_t=I E_{K,K_t}=(b_0, b_1, \ldots, b_{K_t-1})$, and $P_t E_{N_t,c_t}=(1,1, \ldots, 1)^T$ being a all-one vector of length $K_t$, for all $t \in \{1,2,3\}$ and for some integers $K_1 < K_2 < K_3 < K$, the parity check bits are given by $$V_t = \sum_{i=0}^{K_t-1} b_i$$

for $t \in \{1,2,3\}$, where the summation is over binary field (i.e., a modulo-2 summation). Each set of parity check bits $V_t$ are re-inserted into the information block by a combiner so that these parity check bits are also encoded by the next parity-check encoder and the CRC encoder, as illustrated in FIG. 13. The dotted box indicates that the extractor/sampler may be omitted.

According to some embodiments, the selected subsets $\{I_t\}_{t=1}^T$ of information bits satisfy the nested property (1) and that each $I_t$ contains consecutive information bits starting from the first information bit $b_0$. An example is illustrated in FIG. 14.

FIG. 14 is a block diagram illustrating an example recursive CRC encoder structure for a nested sequence of subsets of information bits with parity-check and CRC encoders, according to some embodiments. Each set of parity check bits are re-inserted into the block of information bits through a combiner so that they are re-encoded during the generation of the next set of parity-check bits or CRC bits.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components.

Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3D Three Dimensional
3GPP Third Generation Partnership Project
BTS Base Transceiver Station
CRC Cyclic Redundancy Check
D2D Device to Device
eNB eNodeB
FDD Frequency Division Duplex
LDPC Low Density Parity Check
LLR Log Likelihood Ratio
LTE Long Term Evolution
MAC Medium Access Control
M2M Machine to Machine
MIMO Multi-Input Multi-Output
MTC Machine Type Communication
NR New Radio
OSI Open System Interconnection
PDSCH Physical Downlink Shared Channel
PUCCH Physical Uplink Control Channel
RAN Radio Access Network
RAT Radio Access Technology
RBS Radio Base Station
RNC Radio Network Controller
RRC Radio Resource Control
RRH Remote Radio Head
RRU Remote Radio Unit
SC Successive Cancellation
SCL Successive Cancellation List
SINR Signal-to-Interference-plus-Noise Ratio
TDD Time Division Duplex
UE User Equipment
UL Uplink
UTRAN Universal Terrestrial Radio Access Network
WAN Wireless Access Network

The invention claimed is:

1. A method for use in a wireless transmitter, the method comprising:

obtaining a set of information bits for wireless transmission;

dividing the set of information bits into one or more subsets of information bits by dividing the information bits into nested subsets wherein each successive subset includes the information bits from a previous subset;

for each subset of the one or more subsets of information bits, generating extra cyclic redundancy check (CRC) bits using a CRC polynomial capable of generating N CRC bits and wherein the extra CRC bits for each subset of information bits comprise less than N CRC bits by recursive generation wherein a set of extra CRC bits for a first subset of the one or more subsets of information bits are included a second subset of the one or more subsets of information bits and used as input in a subsequent generation of extra CRC bits for the second subset of information bits;

generating a final set of N or less CRC bits for the set of information bits using the CRC polynomial;

generating a set of coded bits by encoding the set of information bits for wireless transmission, together with the extra CRC bits and the final set of CRC bits, using a polar encoder; and transmitting the set of coded bits using a wireless transmitter.

2. A wireless transmitter comprising processing circuitry operable to:

obtain a set of information bits for wireless transmission;

divide the set of information bits into one or more subsets of information bits by dividing the information bits into nested subsets wherein each successive subset includes the information bits from a previous subset;

for each subset of the one or more subsets of information bits, generate extra cyclic redundancy check (CRC) bits using a CRC polynomial capable of generating N CRC bits and wherein the extra CRC bits for each subset of information bits comprise less than N CRC bits by recursive generation wherein a set of extra CRC bits for a first subset of the one or more subsets of information bits are included a second subset of the one or more subsets of information bits and used as input in a subsequent generation of extra CRC bits for the second subset of information bits;

generate a final set of N or less CRC bits for the set of information bits using the CRC polynomial;

generate a set of coded bits by encoding the set of information bits for wireless transmission, together with the extra CRC bits and the final set of CRC bits, using a polar encoder; and transmit the set of coded bits using a wireless transmitter.

3. The wireless transmitter of claim 2, wherein the processing circuitry is operable to divide the information bits into one or more subsets of information bits by dividing the information bits into separate subsets wherein each subset includes different information bits than the other subsets.

4. The wireless transmitter of claim 2, wherein the processing circuitry operable to generate extra CRC bits comprises a shift register where intermediate values in the shift register are used for determining the extra CRC bits.

5. The wireless transmitter of claim 2, wherein the processing circuitry is operable to encode the set of information bits for wireless transmission by inserting the extra CRC bits for each subset of information bits after its corresponding subset of information bits.

6. The wireless transmitter of claim 2, wherein the processing circuitry is operable to encode the set of information bits for wireless transmission by inserting the extra CRC bits for each subset of information bits as a group after the set of information bits.

7. The wireless transmitter of claim 2, wherein a number of extra CRC bits for each successive subset of the one or more subsets of information bits is greater than or equal to a number of extra CRC bits for a previous subset of the one or more subsets of information bits.

8. The wireless transmitter of claim 2, wherein the wireless transmitter comprises a network node.

9. The wireless transmitter of claim 2, wherein the wireless transmitter comprises a wireless device.

* * * * *